United States Patent [19]
Shi et al.

[11] Patent Number: 5,935,721
[45] Date of Patent: Aug. 10, 1999

[54] ORGANIC ELECTROLUMINESCENT ELEMENTS FOR STABLE ELECTROLUMINESCENT

[75] Inventors: Jianmin Shi, Webster; Ching W. Tang, Rochester; Chin H. Chen, Mendon, all of N.Y.

[73] Assignee: Eastman Kodak Company, Rochester, N.Y.

[21] Appl. No.: 09/045,388

[22] Filed: Mar. 20, 1998

[51] Int. Cl.$^6$ ................................................. H05B 33/00
[52] U.S. Cl. ........................ 428/690; 428/917; 313/504
[58] Field of Search ................... 428/690, 917; 313/504

[56] References Cited

U.S. PATENT DOCUMENTS

| | | | |
|---|---|---|---|
| 3,172,882 | 3/1965 | Gurnee et al. | 252/501 |
| 3,173,050 | 3/1965 | Gurnee et al. | 313/108 |
| 3,180,730 | 4/1965 | Klupfel et al. | 96/1 |
| 3,567,450 | 3/1971 | Brantly et al. | 96/1.5 |
| 3,658,520 | 4/1972 | Brantly et al. | 252/501 |
| 3,935,031 | 1/1976 | Adler | 136/206 |
| 4,356,429 | 10/1982 | Tang | 313/503 |
| 4,539,507 | 9/1985 | VanSlyke et al. | 313/504 |
| 4,720,432 | 1/1988 | VanSlyke et al. | 428/457 |
| 4,769,292 | 9/1988 | Tang et al. | 428/690 |
| 4,885,211 | 12/1989 | Tang et al. | 428/457 |
| 4,950,950 | 8/1990 | Perry et al. | 313/504 |
| 5,047,687 | 9/1991 | VanSlyke | 313/503 |
| 5,059,861 | 10/1991 | Littman et al. | 313/503 |
| 5,059,862 | 10/1991 | VanSlyke | 313/503 |
| 5,061,569 | 10/1991 | VanSlyke et al. | 428/457 |
| 5,069,975 | 12/1991 | Nakada et al. | 428/457 |
| 5,073,446 | 12/1991 | Scozzafava et al. | |
| 5,104,740 | 4/1992 | Shinkai et al. | 428/457 |
| 5,122,711 | 6/1992 | Wakimoto et al. | 313/504 |
| 5,126,214 | 6/1992 | Tokailin et al. | 428/690 |
| 5,130,603 | 7/1992 | Tokailin et al. | 428/917 |
| 5,141,671 | 8/1992 | Bryan et al. | 252/301.16 |
| 5,142,343 | 8/1992 | Hosokawa et al. | 357/17 |
| 5,150,006 | 9/1992 | VanSlyke et al. | 313/504 |
| 5,151,629 | 9/1992 | VanSlyke | 313/504 |
| 5,227,252 | 7/1993 | Murayama et al. | 428/690 |
| 5,256,945 | 10/1993 | Imai et al. | 313/504 |
| 5,366,811 | 11/1994 | Higashi et al. | 428/457 |
| 5,389,444 | 2/1995 | Hosokawa et al. | 428/457 |
| 5,458,977 | 10/1995 | Hosokawa et al. | 428/917 |
| 5,536,949 | 7/1996 | Hosokawa et al. | 257/400 |

FOREIGN PATENT DOCUMENTS

| | | |
|---|---|---|
| 786926 | 1/1977 | European Pat. Off. . |
| 681019 | 4/1995 | European Pat. Off. . |

OTHER PUBLICATIONS

Tang et al, Electroluminescence of doped organic thin films, J. Appl. Phys. 65(9) May 1, 1989, pp. 3610–3619.

Hamada et al, Influence of the Emission Site on the Running Durability of Organic Electroluminescent Devices, Jpn. J. Appl. Phys. vol. 34 (Dec. 1995), Pt. 2, No. 7A, pp. L824–L826.

Hosokawa et al, High efficient blue electroluminescence from a distyrylarylene emitting layer with a new dopant, Appl. Phys. Lett. 67 (26) Dec. 25, 1995, pp. 3853–3855.

Dresner, Double Injection Electroluminescence in Anthracene, RCA Review, Jun. 1969, pp. 322–334.

*Primary Examiner*—Alexander Thomas
*Attorney, Agent, or Firm*—Raymond L. Owens

[57] ABSTRACT

An organic EL device comprising an anode, a cathode, and an organic electroluminescent element between the anode and the cathode; the organic electroluminescent element includes an organic material or a mixture thereof of 9,10-di-(2-naphthyl)anthracene derivatives.

9 Claims, 2 Drawing Sheets

Multilayer EL device 10

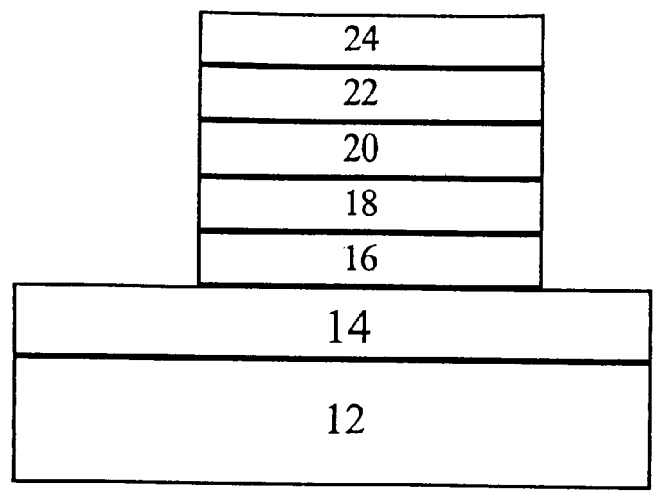
Fig. 1. Multilayer EL device 10
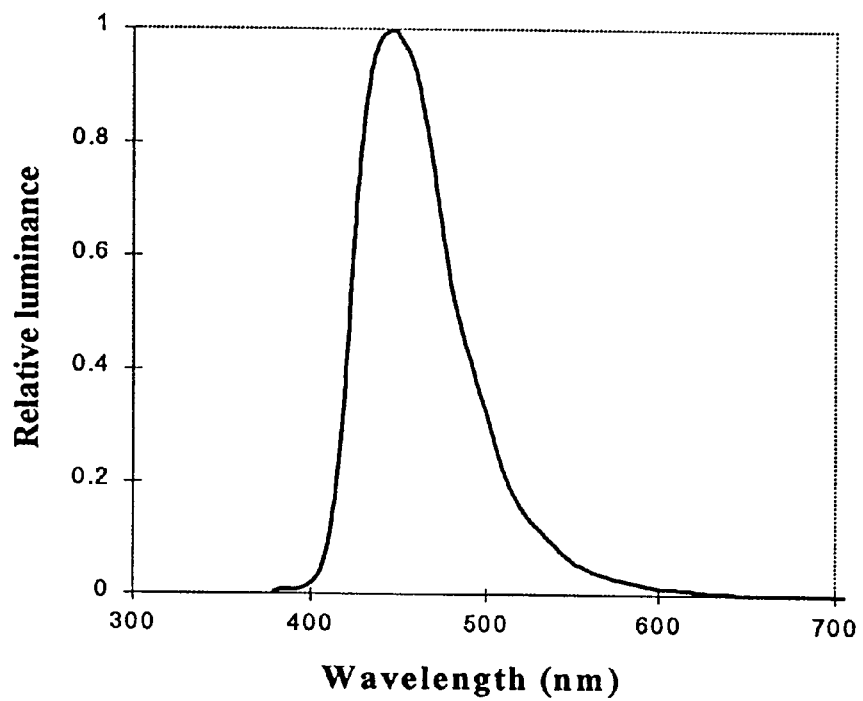
Fig 2.

ORGANIC ELECTROLUMINESCENT ELEMENTS FOR STABLE ELECTROLUMINESCENT

FIELD OF THE INVENTION

The present invention relates to organic electroluminescent (EL) element. More specifically, this invention relates to the use of a novel class of organic materials for producing efficient and stable EL devices.

BACKGROUND OF THE INVENTION

The organic EL device includes an organic EL element consisting of extremely thin layers (<1.0 micrometer in combined thickness) between the anode and the cathode. Herein, the organic EL element is defined as the organic composition between the anode and cathode electrodes. In a basic two-layer EL device structure, one organic layer of the EL element adjacent to the anode is specifically chosen to inject and transport holes, therefore, it is referred to as the hole transport layer, and the other organic layer is specifically chosen to inject and transport electrons, referred to as the electron transport layer. The interface between the two layers provides an efficient site for the recombination of the injected hole-electron pair and the resultant electroluminescence. There is also a three layer organic EL device which contains a light-emitting layer between the hole transport layer and electron transport layer that has been disclosed by Tang et al [J. Applied Physics, Vol. 65, Pages 3610–3616, 1989]. The light-emitting layer commonly consists of a host material doped with a guest material. The host materials in light-emitting layer can be electron transport material, such as 8-hydroxyquinoline aluminum complex [U.S. Pat. No. 4,769,292], transport materials, such as aryl amine [Y. Hamada, T. Sano, K. Shibata and K. Kuroki, Jpn. J. Appl. Phys. 34,824,1995], or charge injection auxiliary material, such as stilbene derivatives [C. Hosokawa et al., Appl. Phys. Lett., 67(25) 3853, 1995]. The doped guest material, also known as the dopant, is usually chosen from highly fluorescent dyes. In the three layer organic EL device, the light-emitting layer provides an efficient site for the recombination of the injected hole-electron pair followed by the energy transfer to the guest material and produces the highly efficient electroluminescence.

In general, the host material in the light emitting layer should be as fluorescent as possible and the fluorescence wavelength should be in the blue or near the UV region. The latter attribute is important for down-shifting of the EL emission energy in a host-guest emitter layer. Among the blue fluorescent materials, 9,10-(diphenyl)anthracene has a near unity fluorescence quantum efficiency in solution. This compound is also highly fluorescent in the solid state. However, as a host the film-forming property of 9,10-(diphenyl)anthracene is very poor, resulting in highly polycrystalline film which tends to produce electrical shorts in the EL device. Several improvements in 9,10-(diphenyl)anthracene have been disclosed. EP 0681019 disclosed the use of a dimeric structure of 9,10-(diphenyl)anthracene in improving the film-forming property and the solid fluorescence efficiency. EP 0786926 disclosed that the amino derivatives of 9,10-(diphenyl)anthracene are useful as emitters in organic EL device.

Organic EL devices are known to be highly efficient and are capable of producing a wide range of colors. Useful applications such as flat-panel displays have been contemplated. The work on the improvement in organic EL devices such as color, stability, efficiency and fabrication methods have been disclosed in U.S. Pat. Nos.: 4,356,429; 4,539,507; 4,720,432; 4,885,211; 5,151,629; 5,150,006; 5,141,671; 5,073,446; 5,061,569; 5,059,862; 5,059,861; 5,047,687; 4,950,950; 4,769,292, 5,104,740; 5,227,252; 5,256,945; 5,069,975; 5,122,711; 5,366,811; 5,126,214; 5,142,343; 5,389,444; 5,458,977; 5,536,949; and 5,683,823.

SUMMARY OF THE INVENTION

In one aspect of the present invention sets forth an organic EL device comprising an anode, a cathode, and an organic electroluminescent element between the anode and the cathode; the organic electroluminescent element includes an organic material or a mixture thereof of 9,10-di-(2-naphthyl) anthracene derivatives.

In another aspect, the present invention provides an organic EL device comprising an anode, a cathode, and an organic electroluminescent element between the anode and the cathode; the organic electroluminescent element includes an organic material or a mixture thereof having the structure:

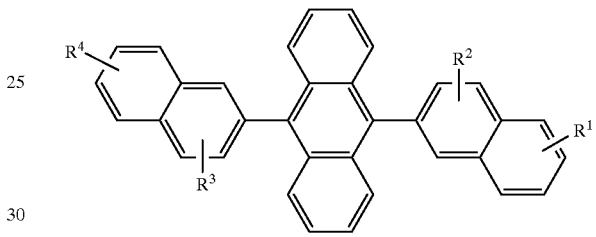

wherein:
  $R^1$, $R^2$, $R^3$, and $R^4$ are individual substituents or a group of substituents, each substituent is individually selected from the following groups consisting of:
Group 1
  hydrogen, or alkyl of from 1 to 24 carbon atoms;
Group 2
  aryl or substituted aryl of from 5 to 20 carbon atoms;
Group 3
  carbon atoms from 4 to 24 necessary to complete a fused aromatic ring of anthracenyl, pyrenyl, or perylenyl;
Group 4
  heteroaryl or substituted heteroaryl of from 5 to 24 carbon atoms, carbon atoms necessary to complete a fused heteroaromatic ring of furyl, thienyl, pyridyl, quinolinyl and other heterocyclic systems;
Group 5
  alkoxyl, amino, alkyl amino, or aryl amino of from 1 to 24 carbon atoms; and
Group 6
  fluorine, chlorine, bromine or cyano.

It is an advantage of the present invention, organic electroluminescent (EL) element, which belongs to 9,10-di-(2-naphthyl)anthracene derivatives, provides a thermally stable, glassy, and highly fluorescent materials in condensed thin film which dramatically exhibits different EL performance than that of 9,10-(diphenyl)anthracene derivatives. As a result, organic EL device employing 9,10-di-(2-naphthyl)anthracene derivatives in light-emitting layer produce a bright blue emission and long operational stability.

In accordance with the present invention, it has also been found that this novel class of 9,10-di-(2-naphthyl)anthracene derivatives are extremely useful for the production of full color EL display panel. With 9,10-di-(2-naphthyl)

anthracene derivatives as host materials, an appropriate EL hues or colors, including white, have also been produced by a downhill energy transfer process. For example, a green EL emission has been produced by doping into 9,10-di-(2-naphthyl)anthracene derivatives with small amount of a green fluorescent sensitizing dye. This host-guest energy transfer scheme has been discussed in detail by Tang et al [U.S. Pat. No. 4,769,292]. A white EL emission has been produced by selecting an appropriate red fluorescent sensitizing dye into 9,10-di-(2 -naphthyl)anthracene host. Combination of these two emission to produce white electroluminescence scheme has been disclosed in detail by Shi et al [U.S. Pat. No. 5,683,823].

BRIEF DESCRIPTION OF THE DRAWINGS

This invention can be better appreciated by reference to the following detailed description considered in conjunction with the drawings in which:

FIG. 1 shows schematic diagrams of the multi-layer structures of preferred EL devices of this invention;

FIG. 2 shows the spectral characteristic of an EL device described in Example 5;

DETAILED DESCRIPTION OF THE PREFERRED EMBODIMENTS

Figure 3:
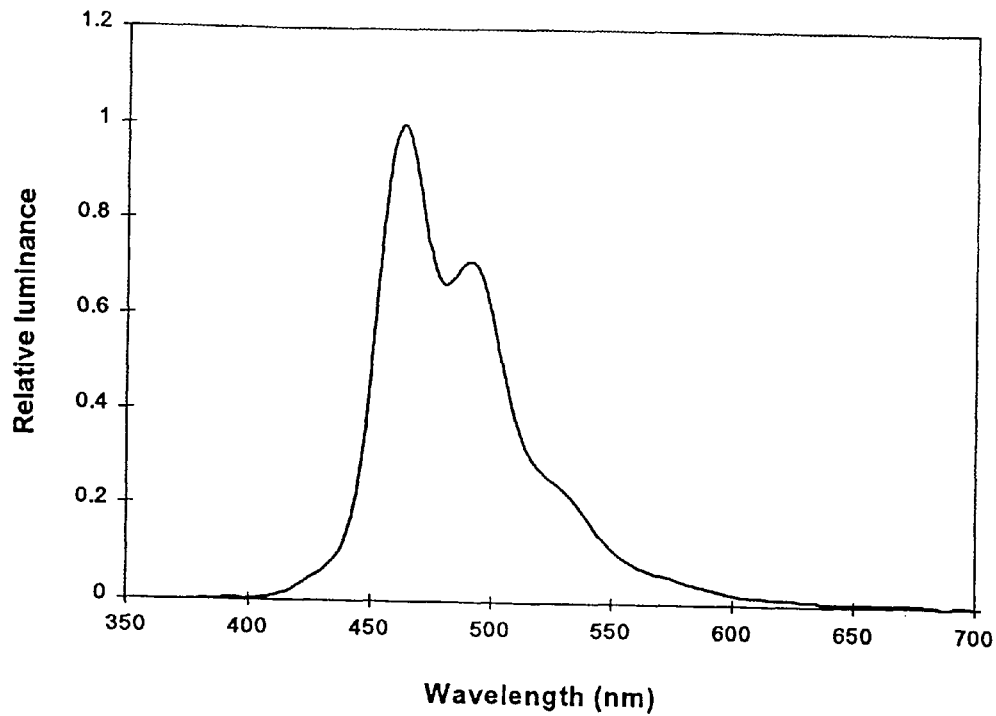
FIG. 3 shows the spectral characteristic of an EL device described in Example 7.

The present invention provides an efficient blue emission and long life durability organic EL device 10 is shown. The device includes an anode 14 on a glass substrate 12, a hole injecting layer (HIL) 16, a hole transport layer (HTL) 18, a light-emitting layer (EML) 20, an electron transport layer (ETL) 22, and a cathode 24. FIG. 1 shows the schematic diagram of this multi-layer structure of preferred EL devices of this invention.

A layer containing a porphyrinic compound forms the hole injecting layer (HIL) of the organic EL device. A porphyrinic compound is any compound, natural or synthetic, which is derived from or includes a porphyrin structure, including porphine itself. Any of the prophyrinic compounds disclosed by Adler, U.S. Pat. No. 3,935,031 or Tang U.S. Pat. No. 4,356,429, the disclosures of which are here incorporated by reference, can be employed.

Preferred porphyrinic compounds are those of structural formula (II):

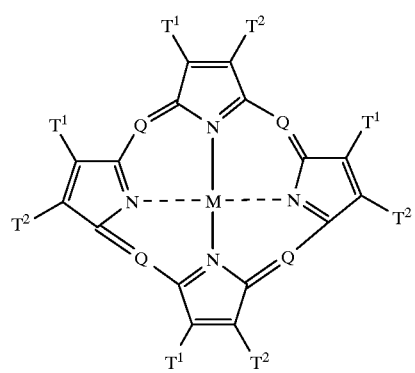

(II)

wherein

Q is —N= or—C(R)=;

M is a metal, metal oxide, or metal halide;

R is hydrogen, alkyl, aralkyl, aryl, or alkaryl; and $T^1$ and $T^2$ represent hydrogen or together complete a unsaturated six member ring, which can include substituent, such as alkyl or halogen. Preferred six membered rings are those formed of carbon, sulfur, and nitrogen ring atoms. Preferred alkyl moieties contain from about 1 to 6 carbon atoms while phenyl constitutes a preferred aryl moiety.

In an alternative preferred form the porphyrinic compounds differ from those of structural formula (I) by substitution of two hydrogens for the metal atom, as indicated by formula (III):

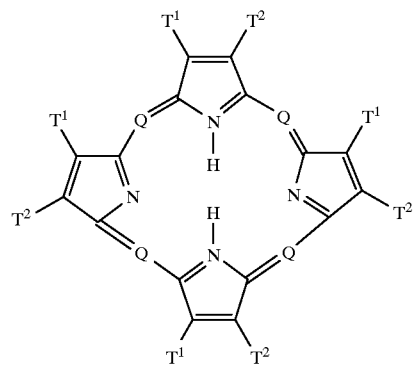

(III)

Highly preferred examples of useful porphyrinic compounds are metal free phthalocyanines and metal containing phthalocyanines. While the porphyrinic compounds in general and the phthalocyanines in particular can contain any meal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:

Porphine 1,10,15,20-tetraphenyl-21H,23H-porphine copper (II)

1,10,15,20-tetrapheyl-21H,23H-porphine zinc (II)

Copper phthlocyanine

Chromium phthalocyanine fluoride

The hole transporting layer (HTL) of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinyl radicals and/or containing at least one active hydrogen containing group are disclosed by Brantley et al U.S. Pat. Nos. 3,567,450 and 3,658,520.

Another class of aromatic tertiary amines are those which include at least two aromatic tertiary amine moieties. Such compounds include those represented by structural formula (IV).

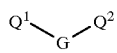 (IV)

wherein
Q¹ and Q² are independently aromatic tertiary amine moieties and
G is a linking group such as an arylene, cycloalkylene, or alkylene group of a carbon to carbon bond.

A preferred class of triarylamines satisfying structural formula (IV) and containing two triarylamine moieties are those satisfying structural formula (V):

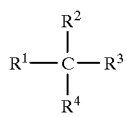 (V)

where
R¹ and R² each independently represents a hydrogen atom, an aryl group, or an alkyl group or R¹ and R² together represent the atoms completing a cycloalkyl group; and
R³ and R⁴ each independently represents an aryl group which is in turn substituted with a diaryl substituted amino group, as indicated by structural formula (VI):

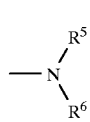 (VI)

wherein R⁵ R⁶ are independently selected aryl groups.

Another preferred class of aromatic tertiary amines are tetraaryldiamines. Preferred tetraaryldiamines include two diarylamino groups, such as indicated by formula (VII), linked through an arylene group:

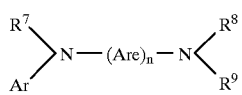 (VII)

wherein
Are is an arylene group,
n is an integer of from 1 to 4, and
Ar, R⁷, R⁸, and R⁹ are independently selected aryl groups.

The various alkyl, alkylene, aryl, and arylene moieties of the foregoing structural formulae (IV), (V), (VII), can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms-e.g., cyclopentyl, cyclohexyl, and cycloheptyl ring structures. The aryl and arylene moieties are preferably phenyl and phenylene moieties.

Illustrative of useful hole transport compounds are the following:

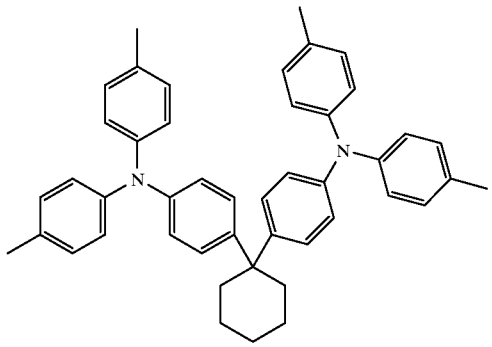

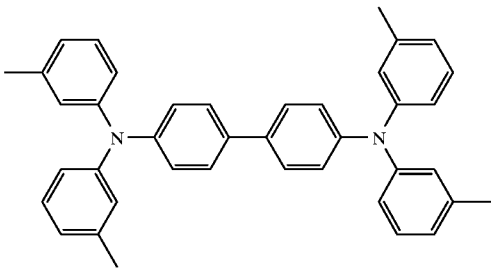

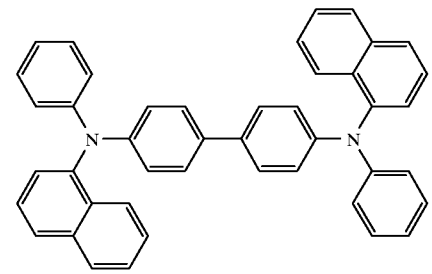

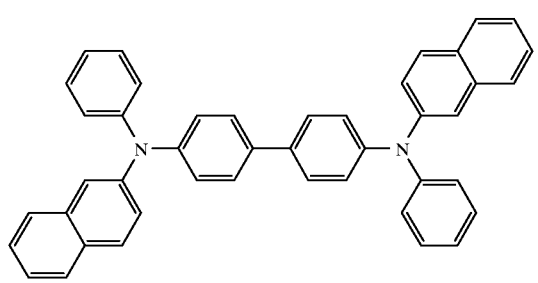

The light-emitting layer (EML) of the organic EL medium comprises of a luminescent or fluorescent material where electroluminescence is produced as a result of electron-hole pair recombination in this region. In the practice of the present invention, the simplest construction comprises of a single component the host material forming the EL light-emitting layer where light is emitted in response to electron-hole recombination comprises of a 9,10-di-(2-naphthyl) anthracene derivatives or a mixture of 9,10-di-(2-naphthyl) anthracene derivatives of formula 1:

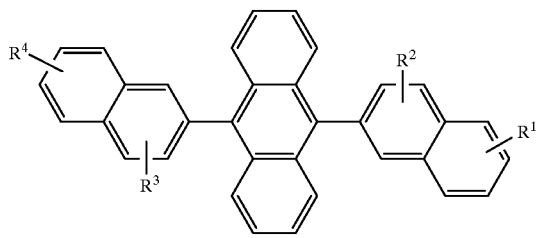

wherein:
R¹, R², R³, and R⁴ are individual substituents or a group of substituents, each substituent is individually selected from the following groups consisting of:

Group 1
hydrogen, or alkyl of from 1 to 24 carbon atoms;

Group 2
aryl or substituted aryl of from 5 to 20 carbon atoms;

Group 3
carbon atoms from 4 to 24 necessary to complete a fused aromatic ring of anthracenyl; pyrenyl, or perylenyl.

Group 4
heteroaryl or substituted heteroaryl of from 5 to 24 carbon atoms, carbon atoms necessary to complete a fused heteroaromatic ring of furyl, thienyl, pyridyl, quinolinyl and other heterocyclic systems;

Group 5
alkoxyl, amino, alkyl amino, or aryl amino of from 1 to 24 carbon atoms; and Group 6
fluorine, chlorine, bromine or cyano.

As the specific 9,10-di-(2-naphthyl)anthracene derivatives represented by the general formula I, the following Compounds Nos. 1–94 are typical examples of the present invention, while it is understood that the present invention shall not be limited to these compounds.

The compounds belonging to Group 1 include Nos. 1–13

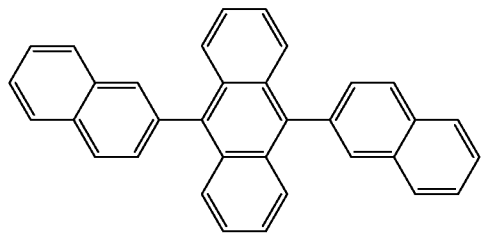

1

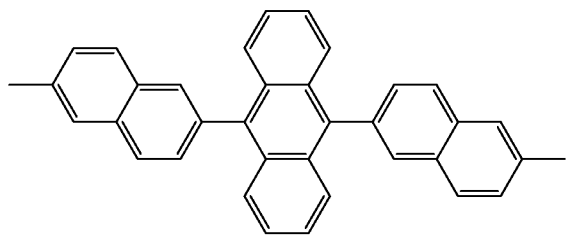

2

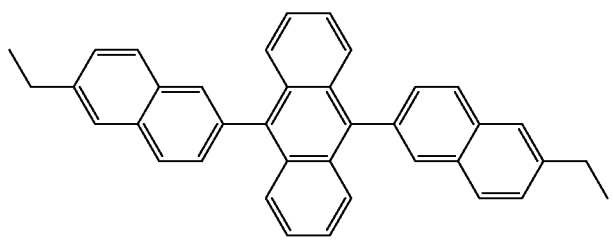

3

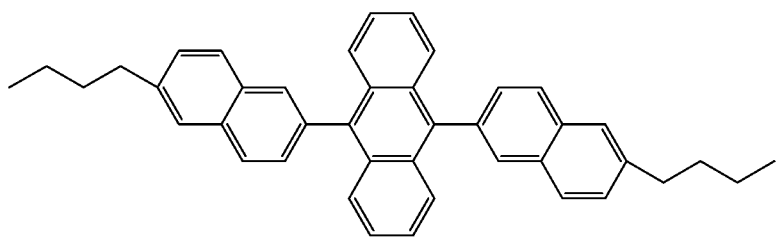

4

5
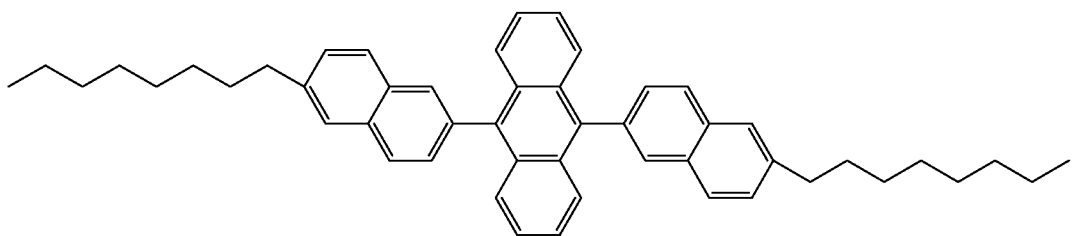
6
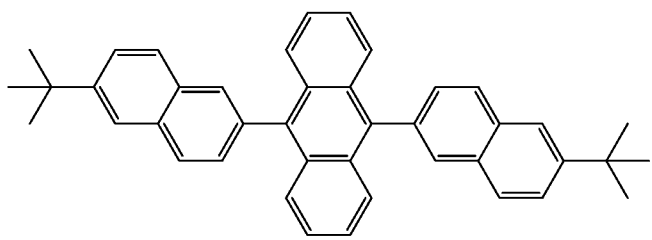
7
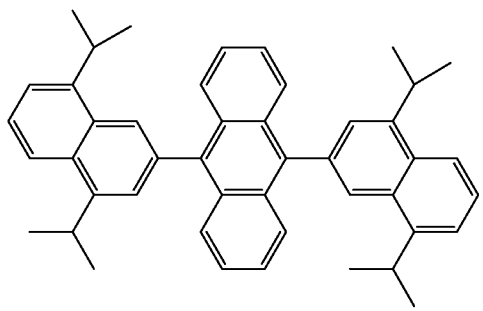
8
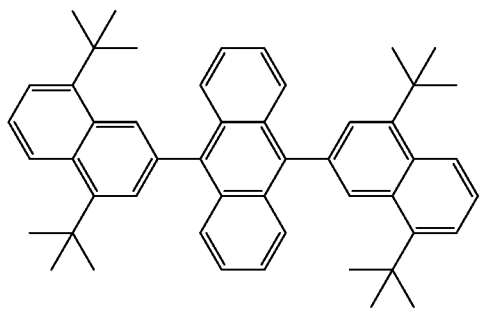
9
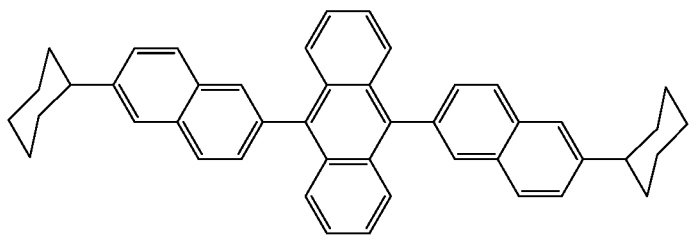

-continued
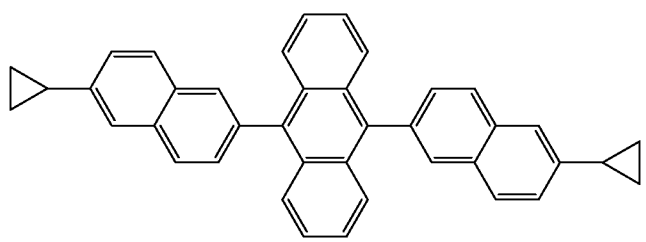
10
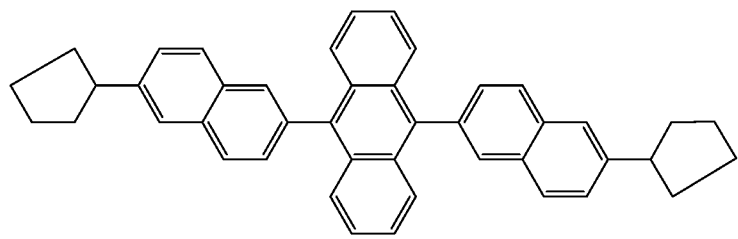
11
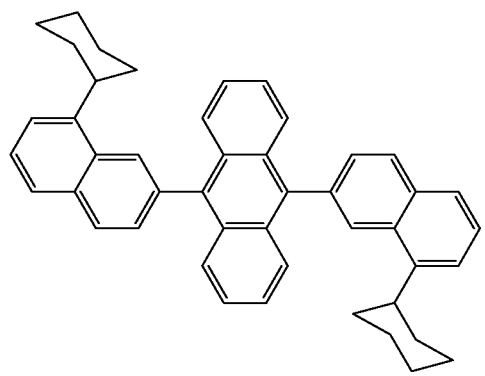
12
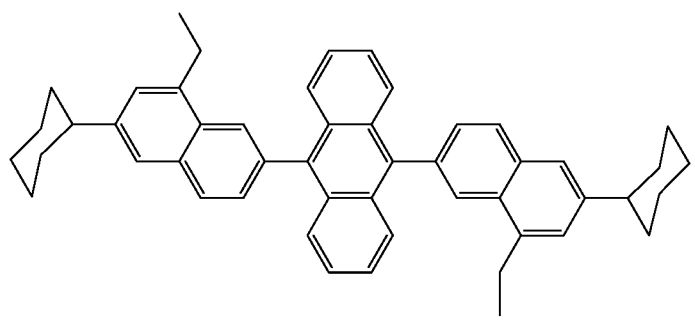
13
The compounds belonging to Group 2 include Nos. 14–20.
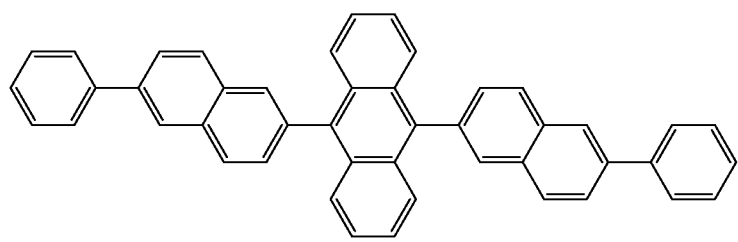
14

-continued
15
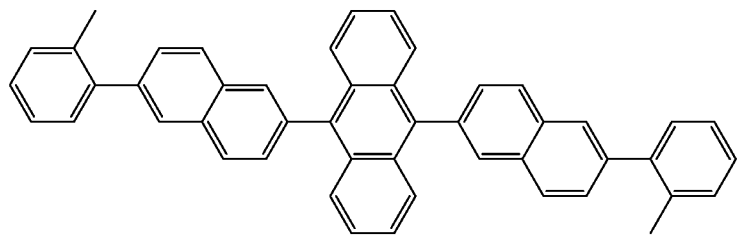
16
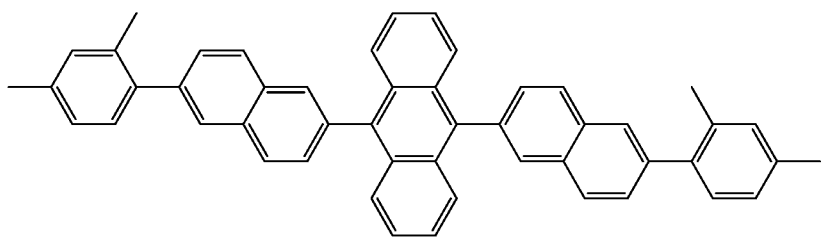
17
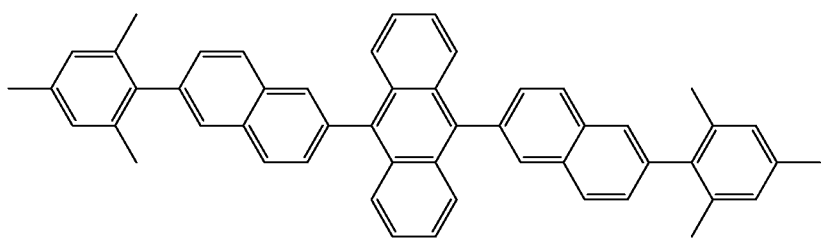
18
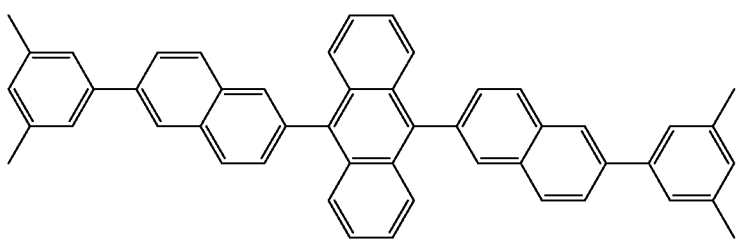
19
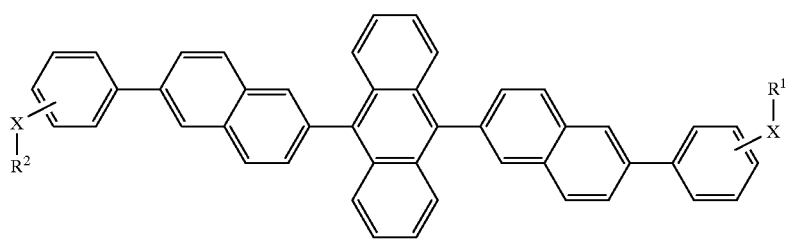
$R^1$ and $R^2$ are individually alkyl, aryl of from 1 to 24 carbon atoms.

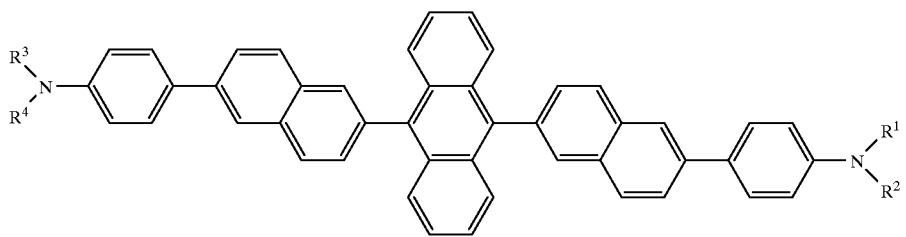
20
R¹, R², R³, and R⁴ are alkyl, aryl of from 1 to 24 carbon atoms.
The compounds belonging to Group 3 include Nos. 21–34.
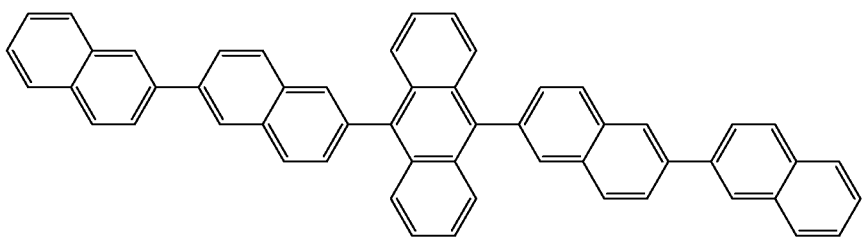
21
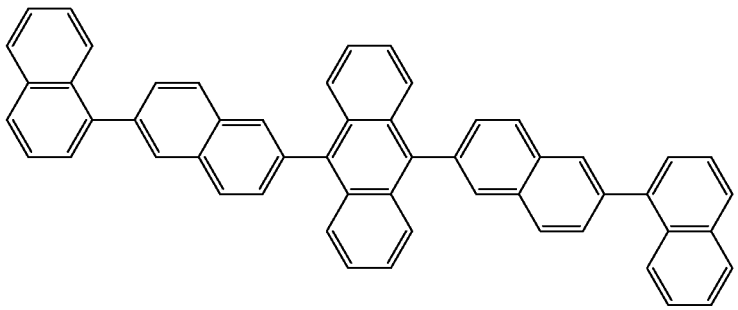
22
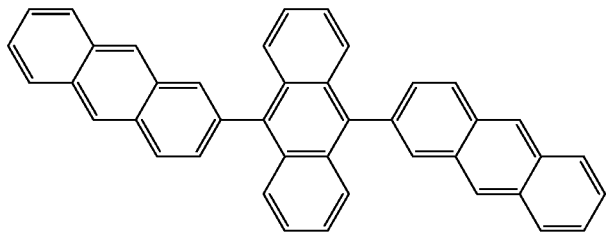
23
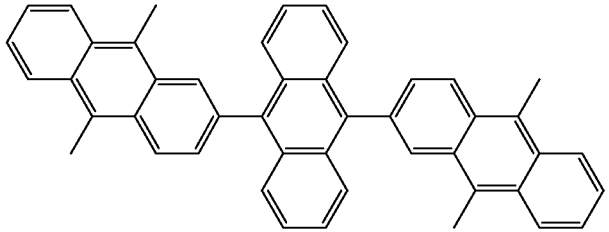
24

25
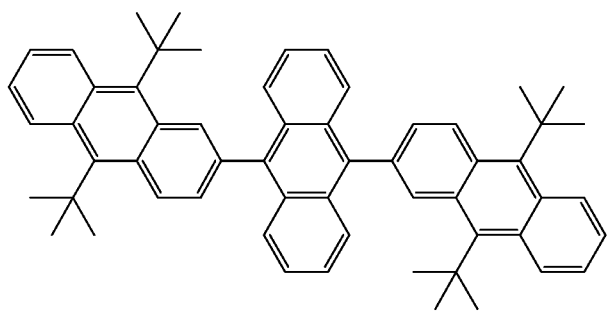
26
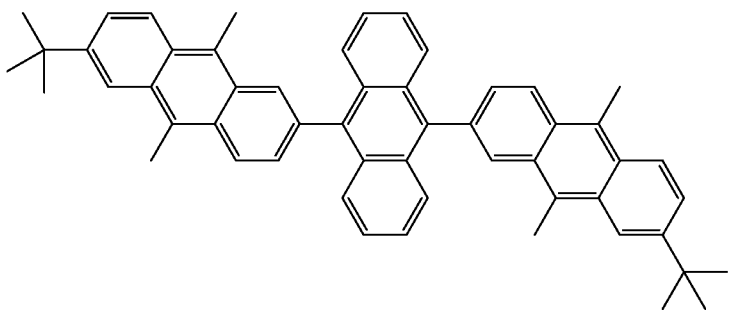
27
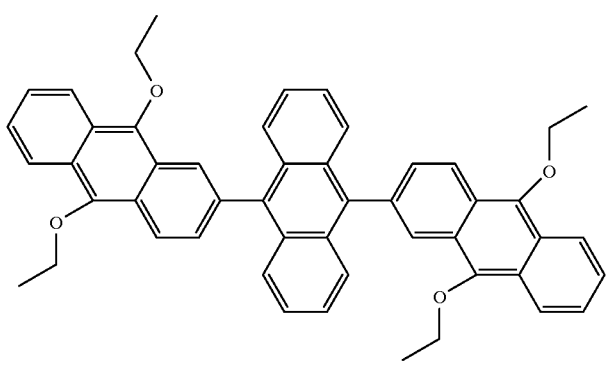
28
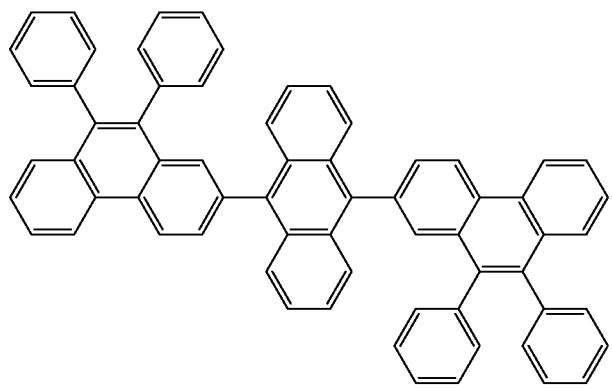

29
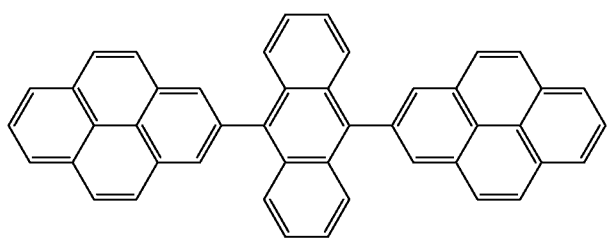
30
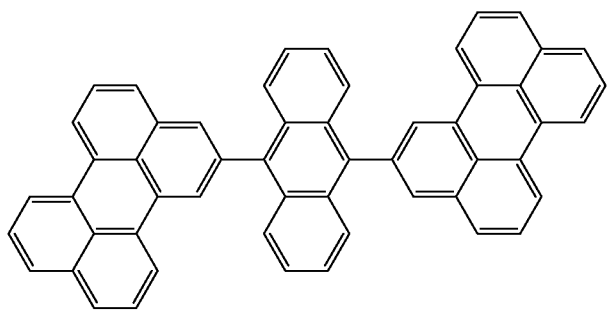
31
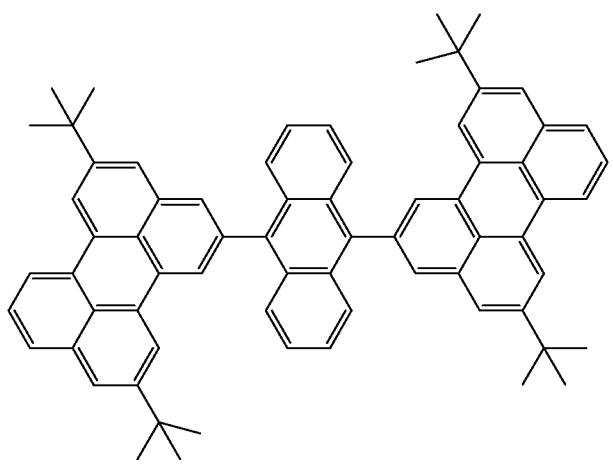
32
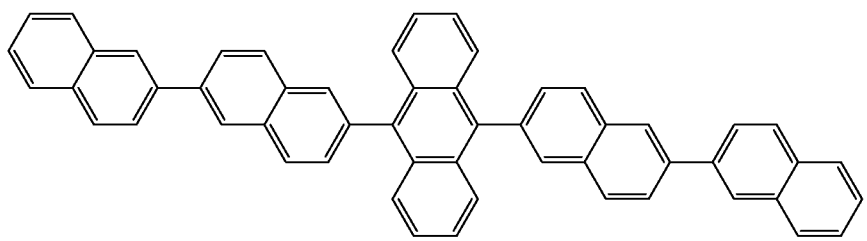
33
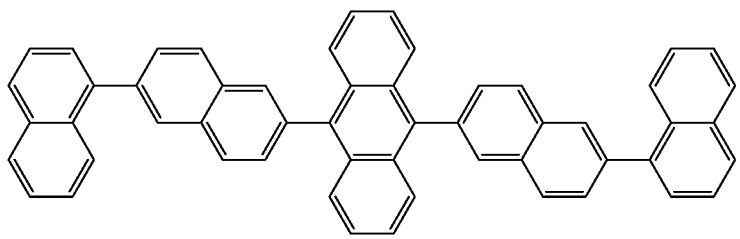

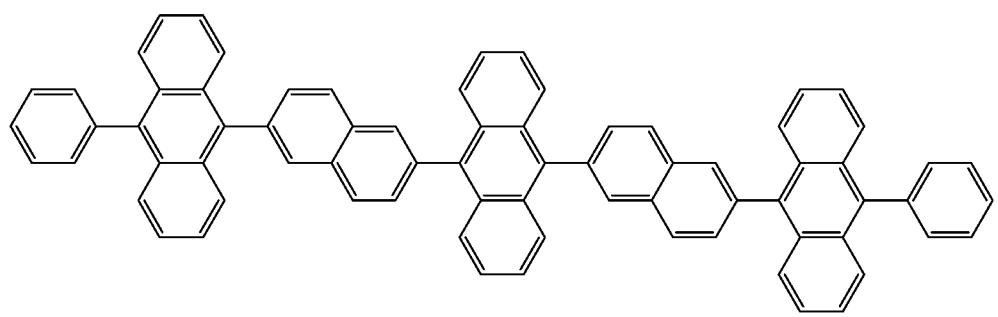
34
The compounds belonging to Group 4 include Nos. 35–52.
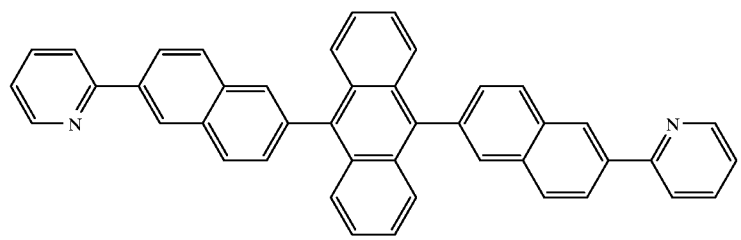
35
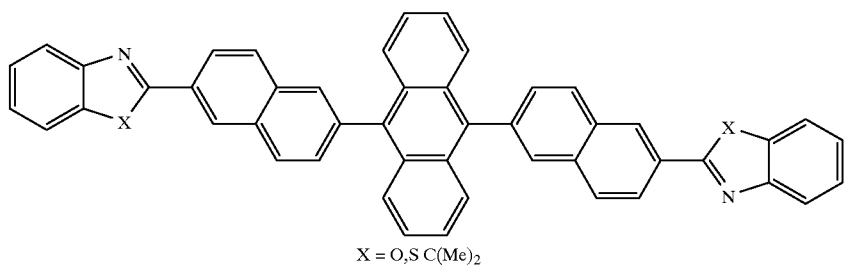
36
X = O, S C(Me)$_2$
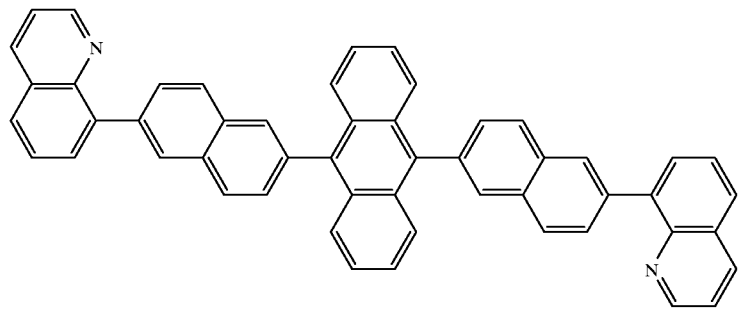
37
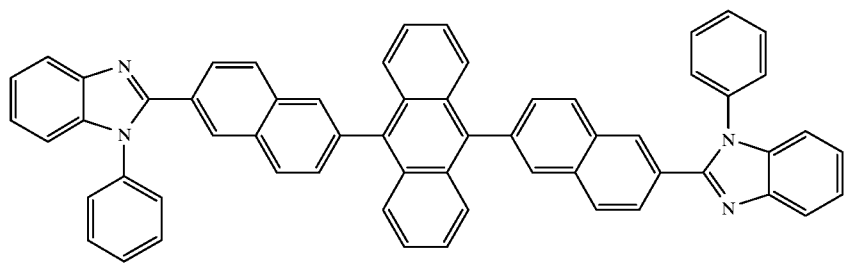
38

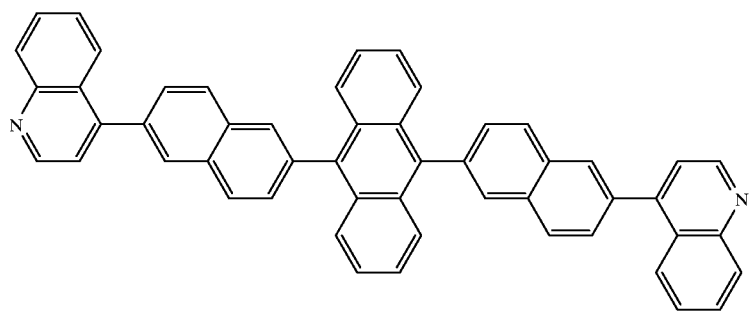
39
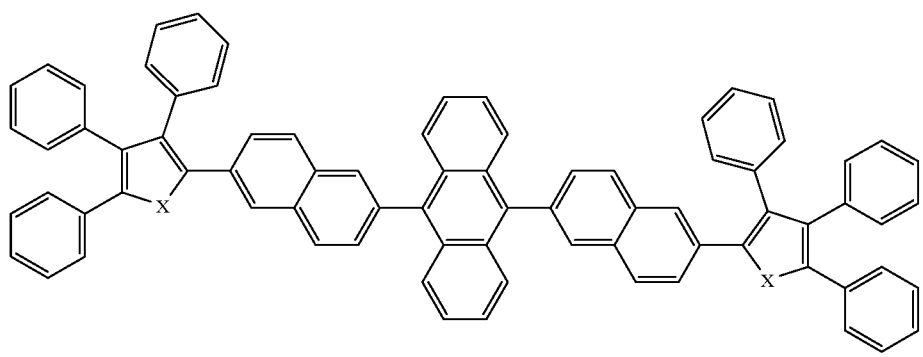
X = O,S.
40
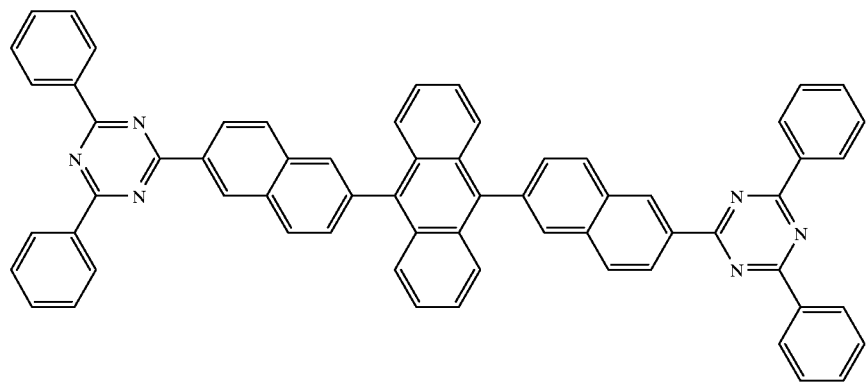
41
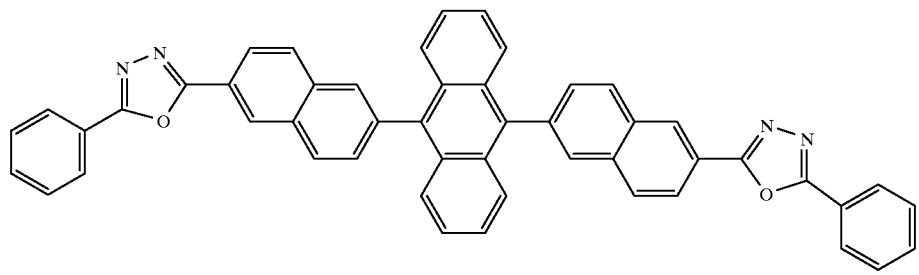
42

43
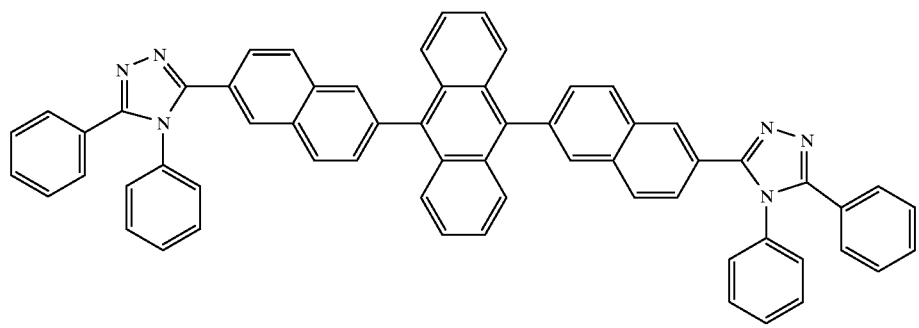
44
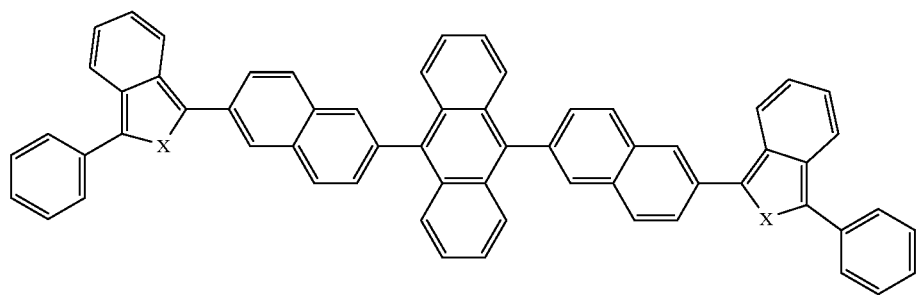
X = O,S.
45
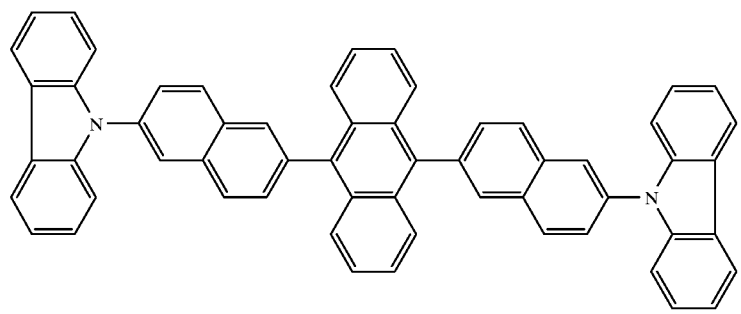
46
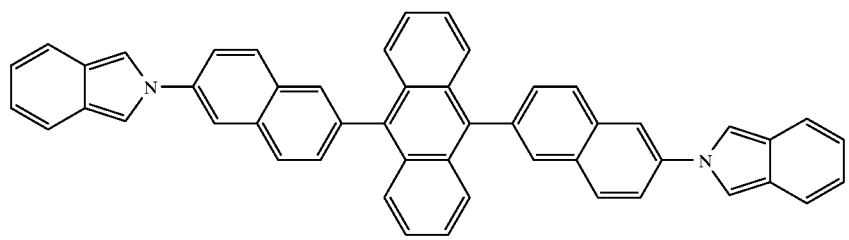

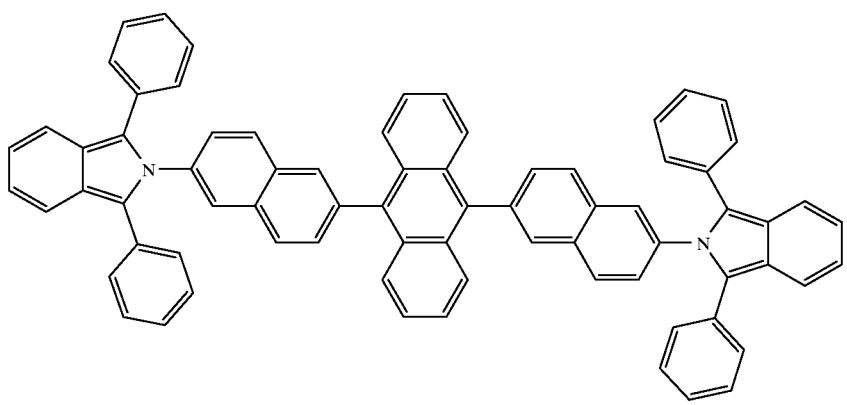
47
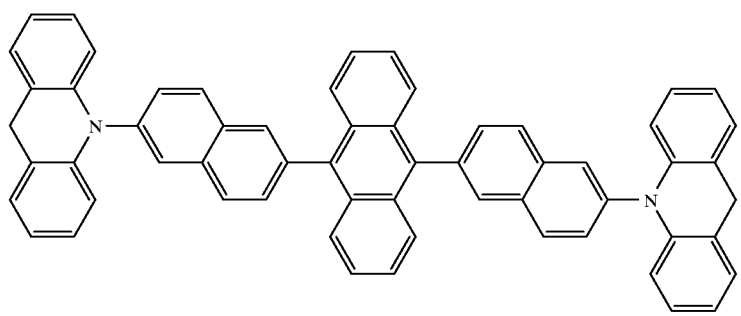
48
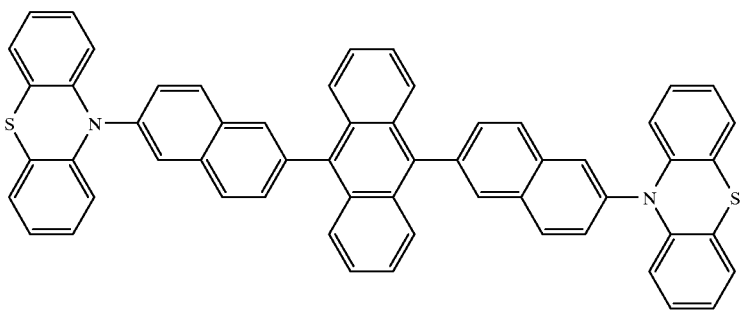
49
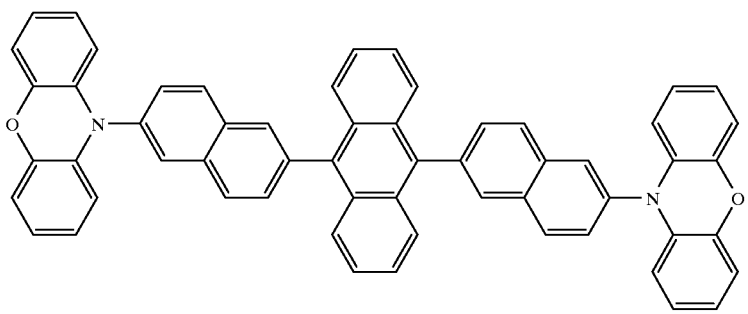
50

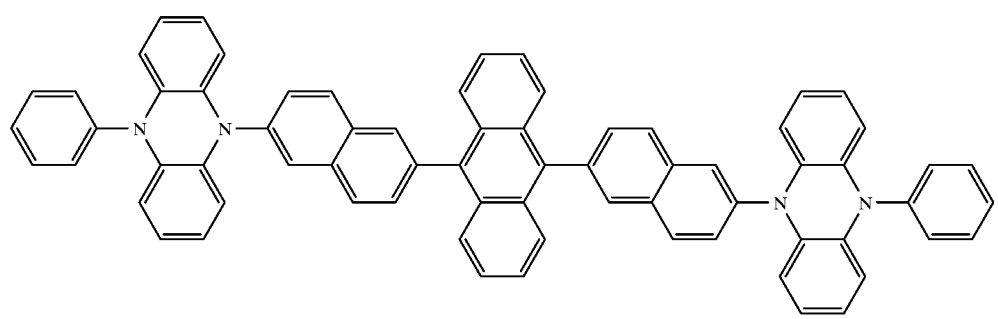
51
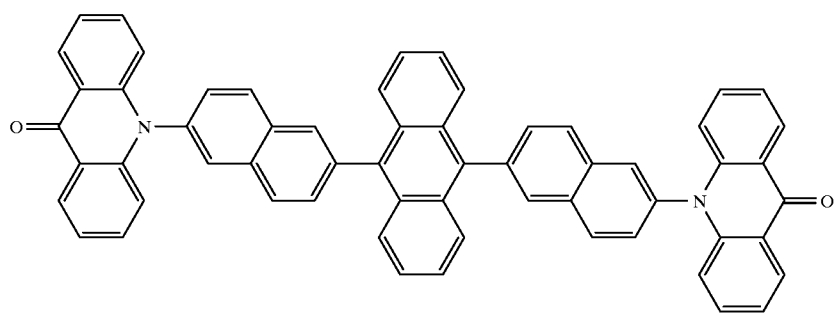
52
The compounds belonging to Group 5 include Nos. 53–86.
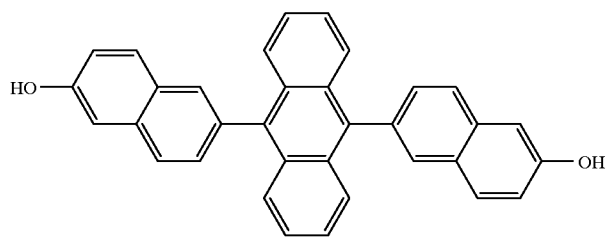
53
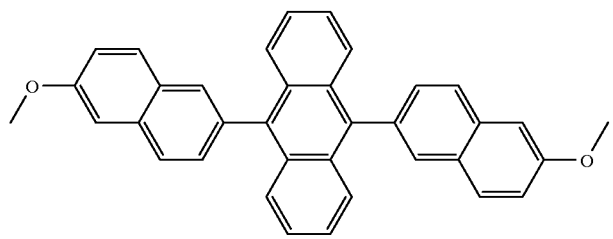
54
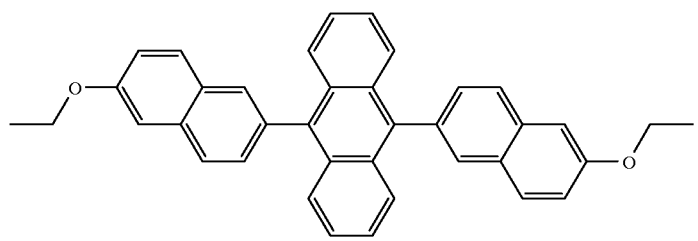
55

56
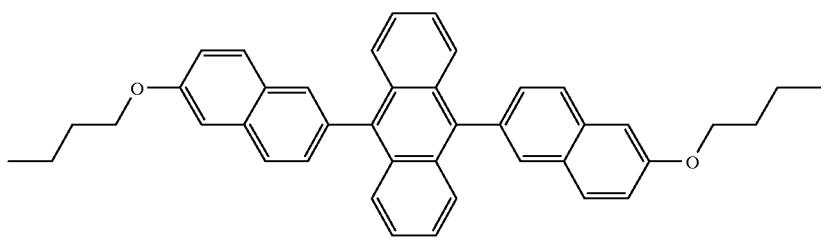
57
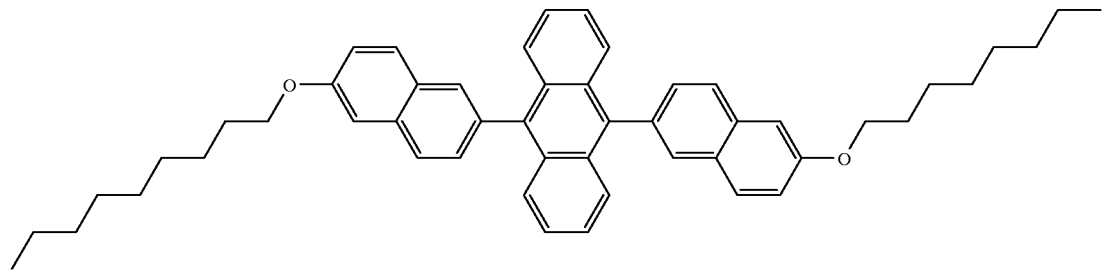
58
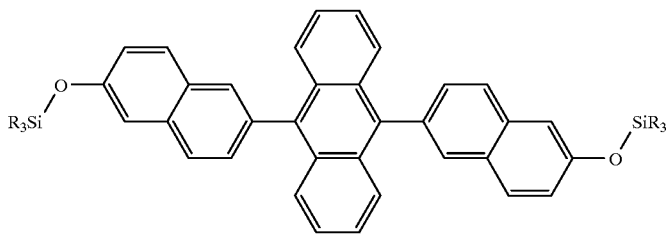
59
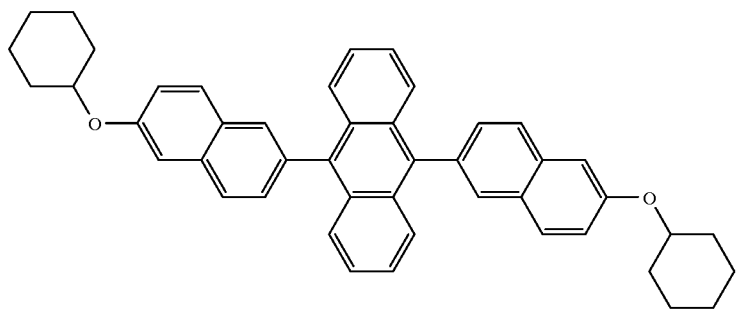
60
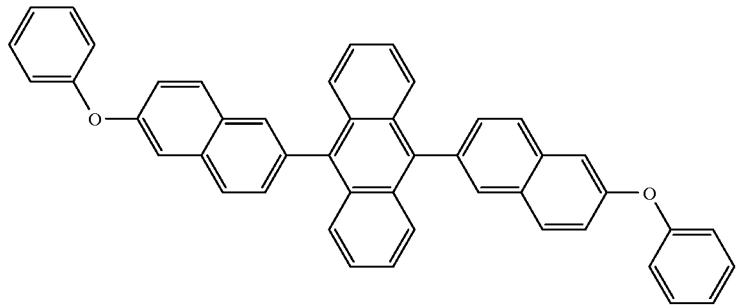

61
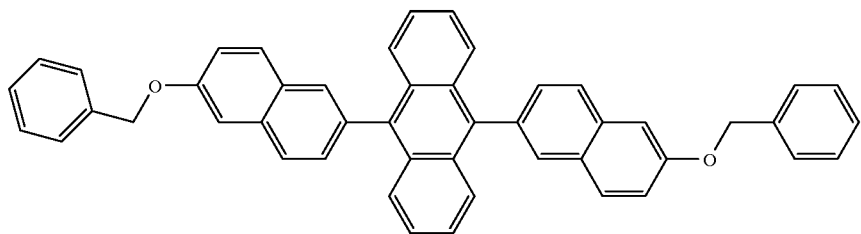
62
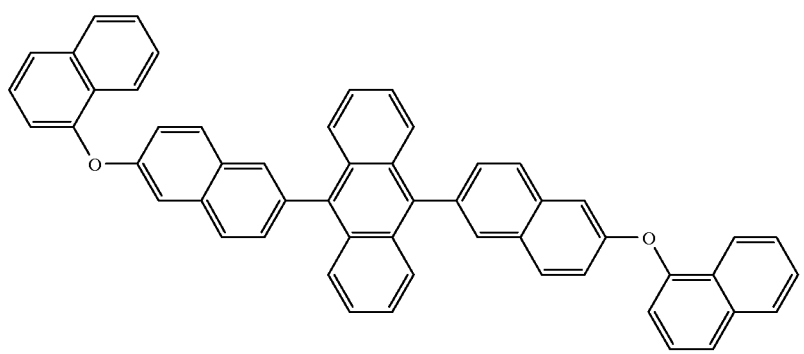
63
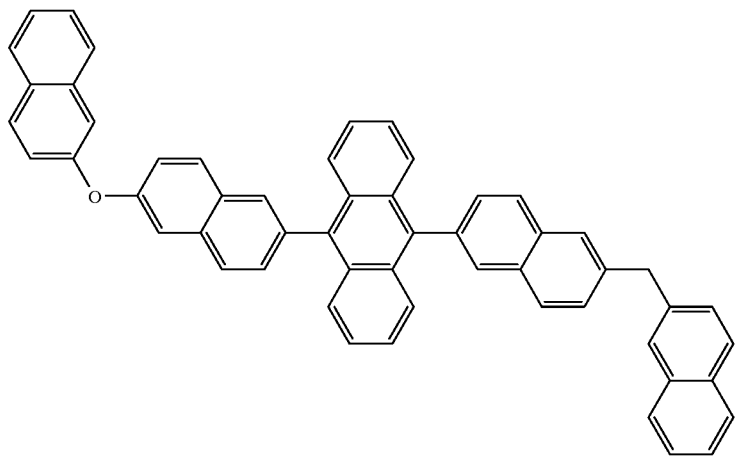
64
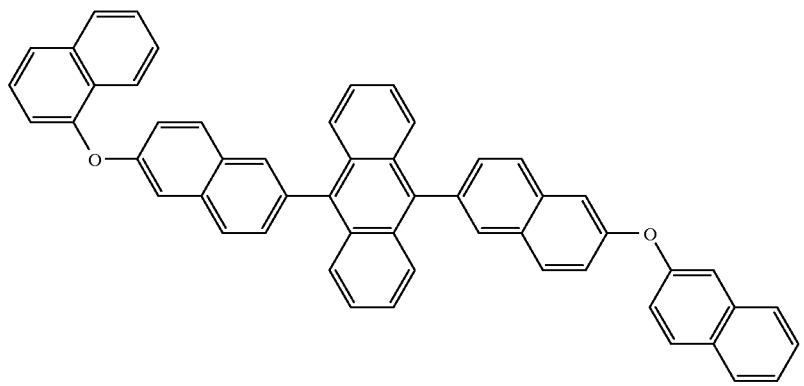

65
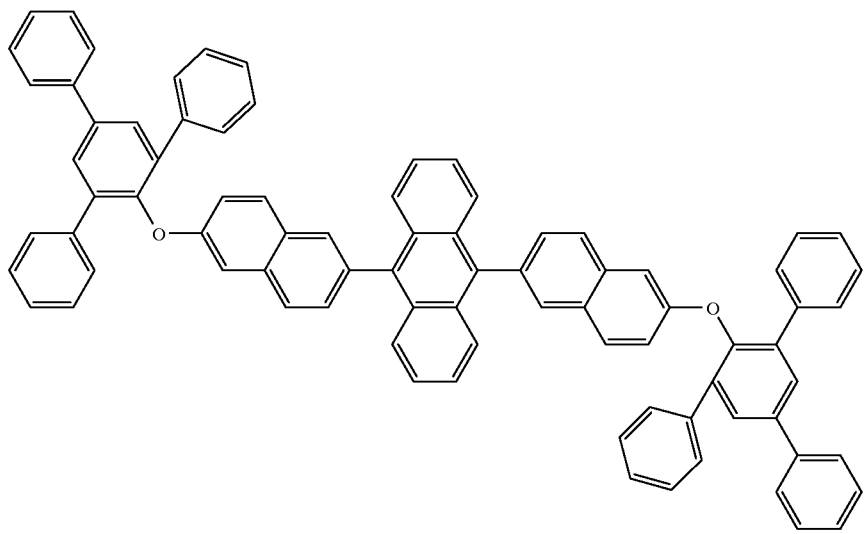
66
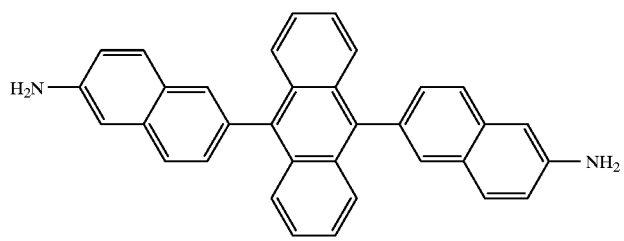
67
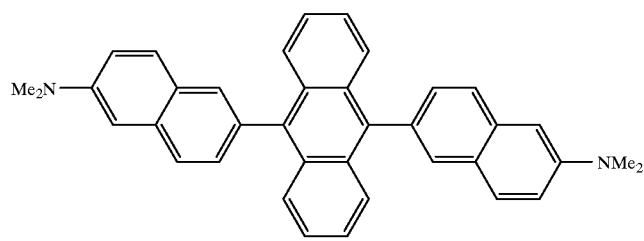
68
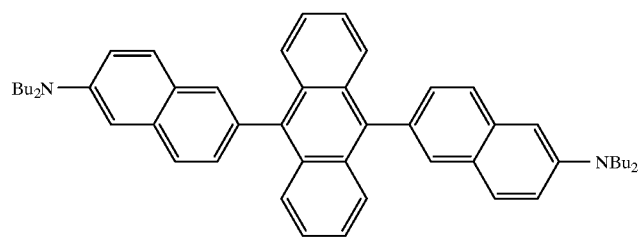
69
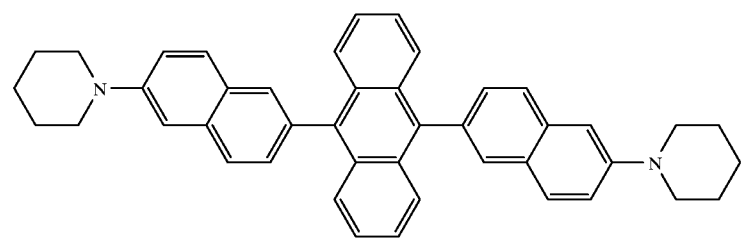

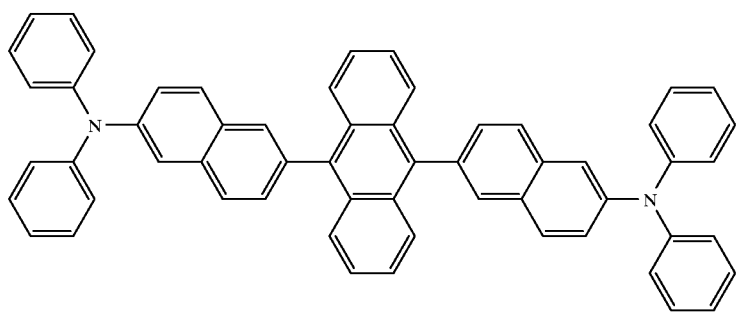
70
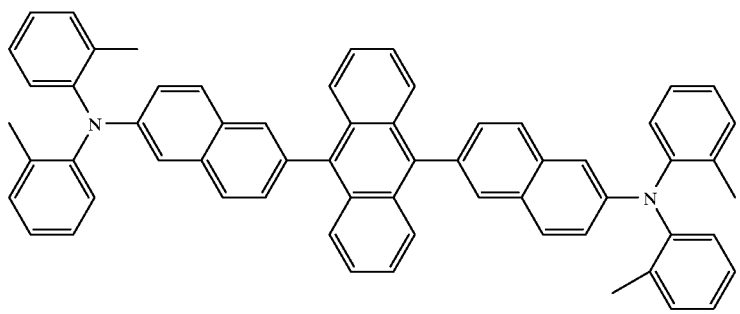
71
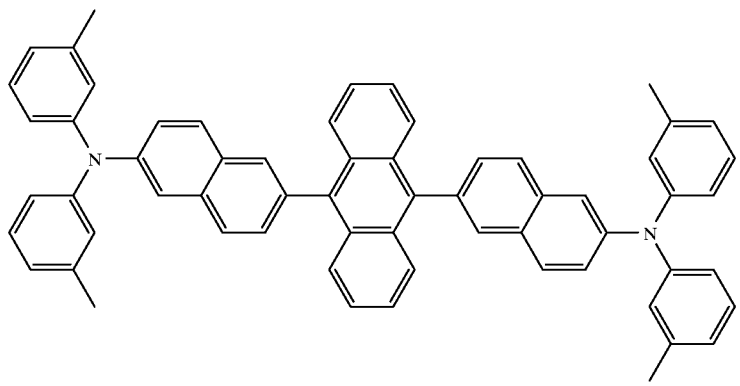
72
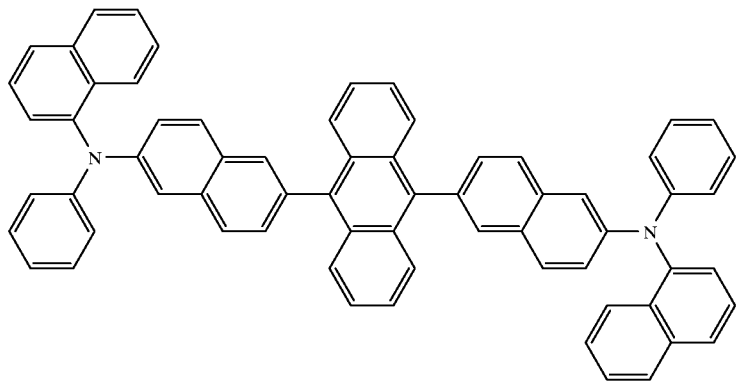
73

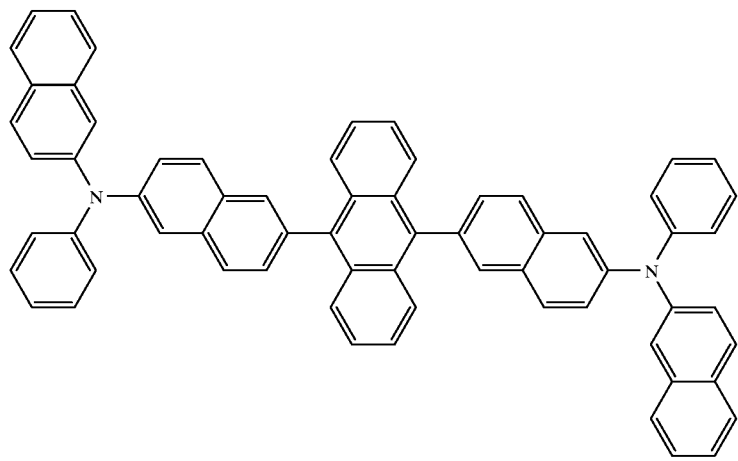
74
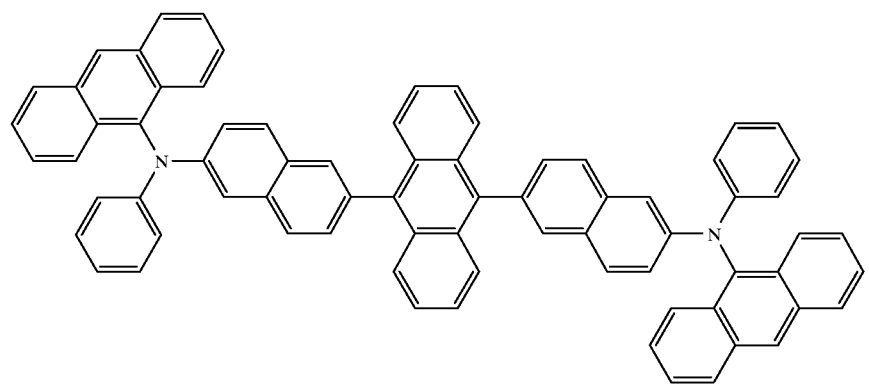
75
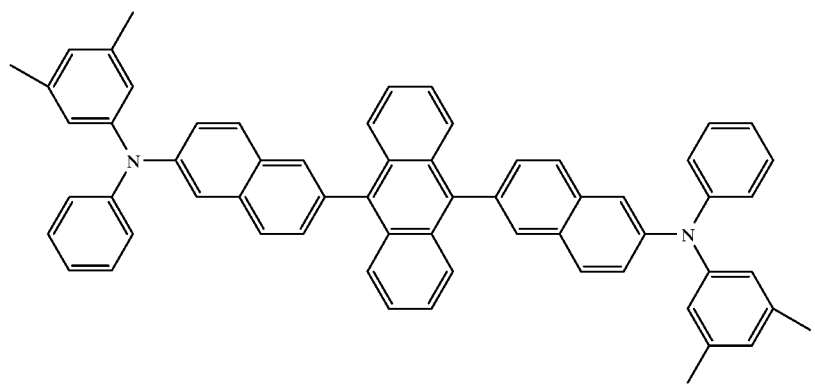
76

77
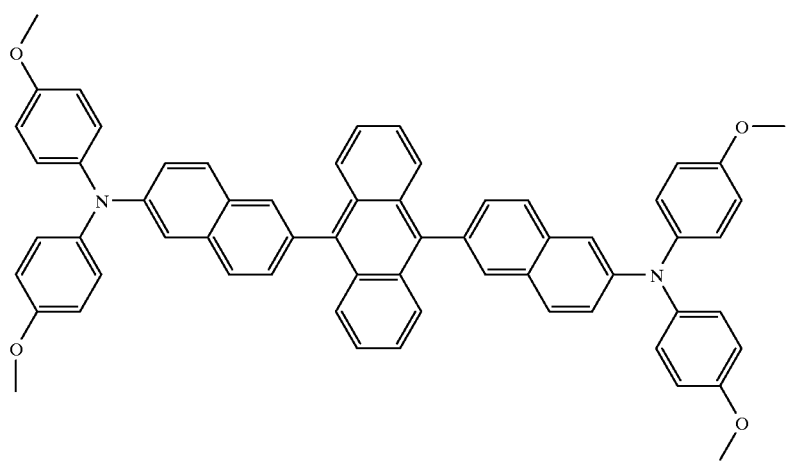
78
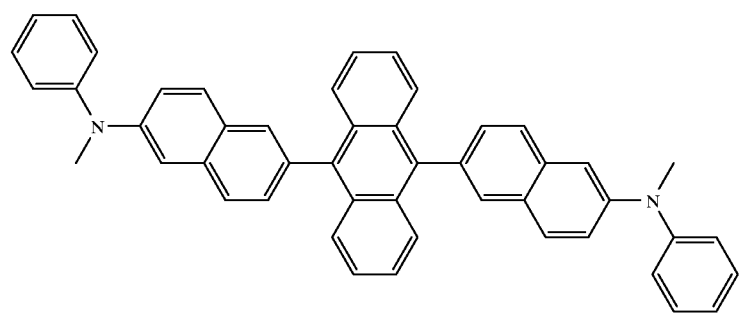
79
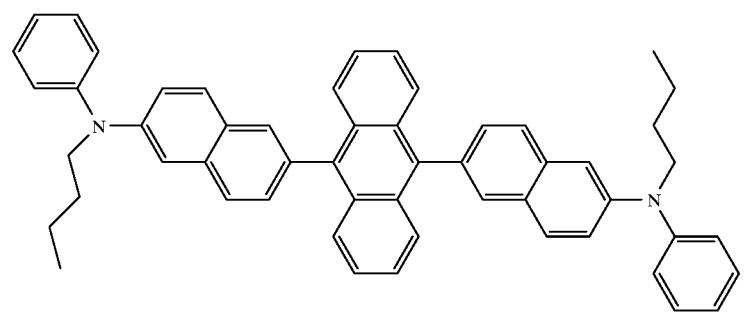
80
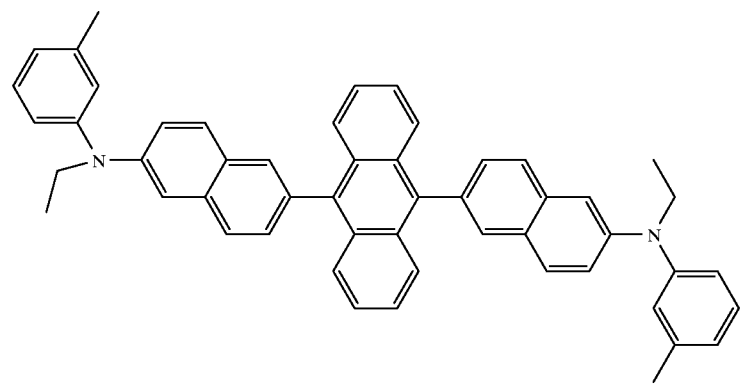

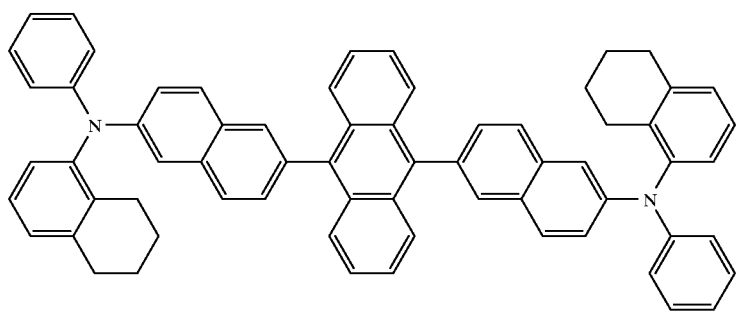
81
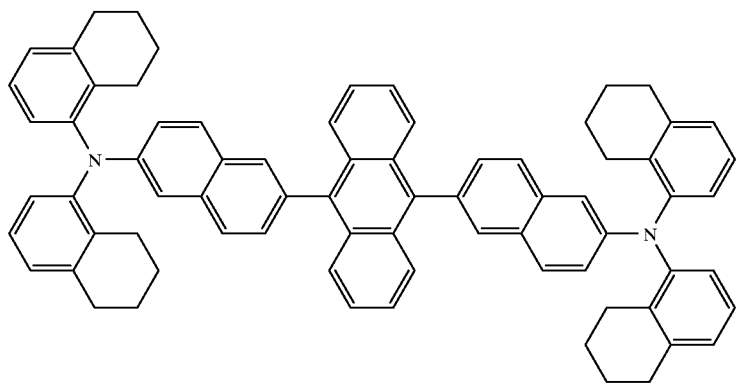
82
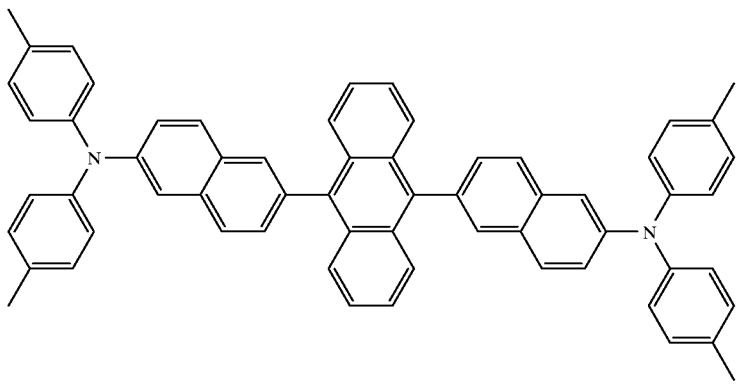
83
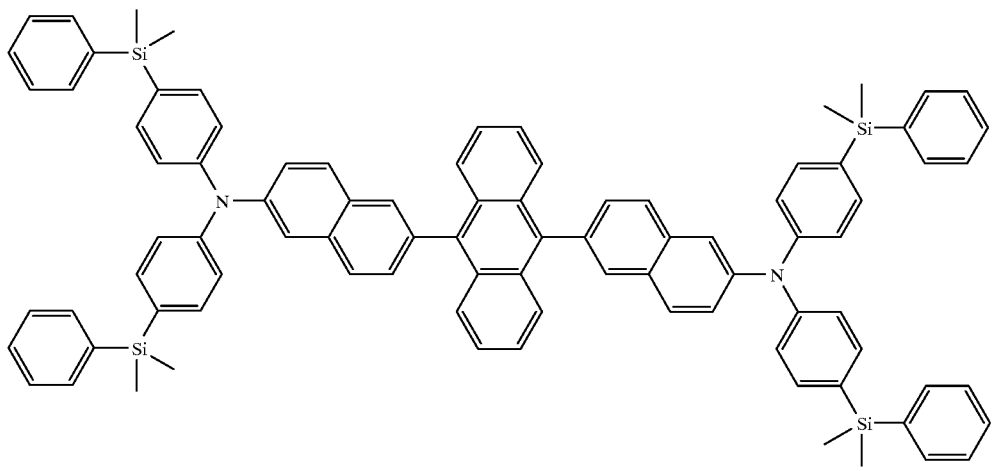
84

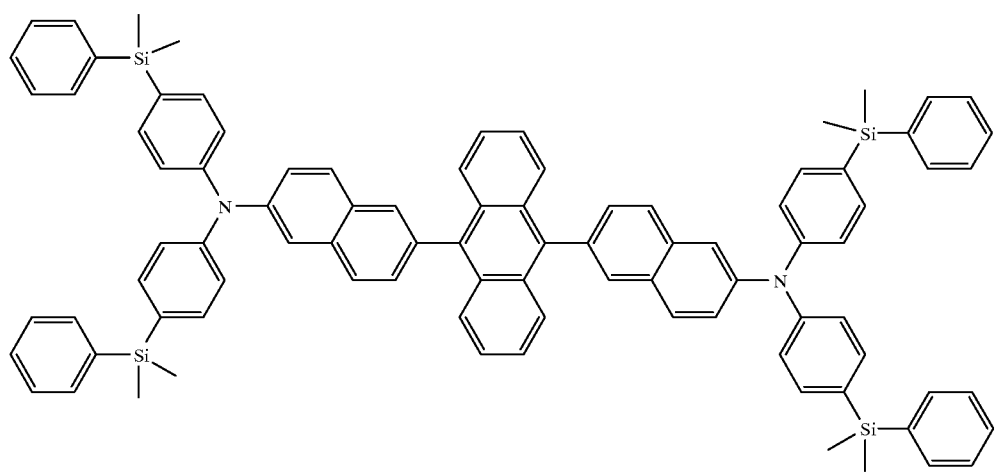
85
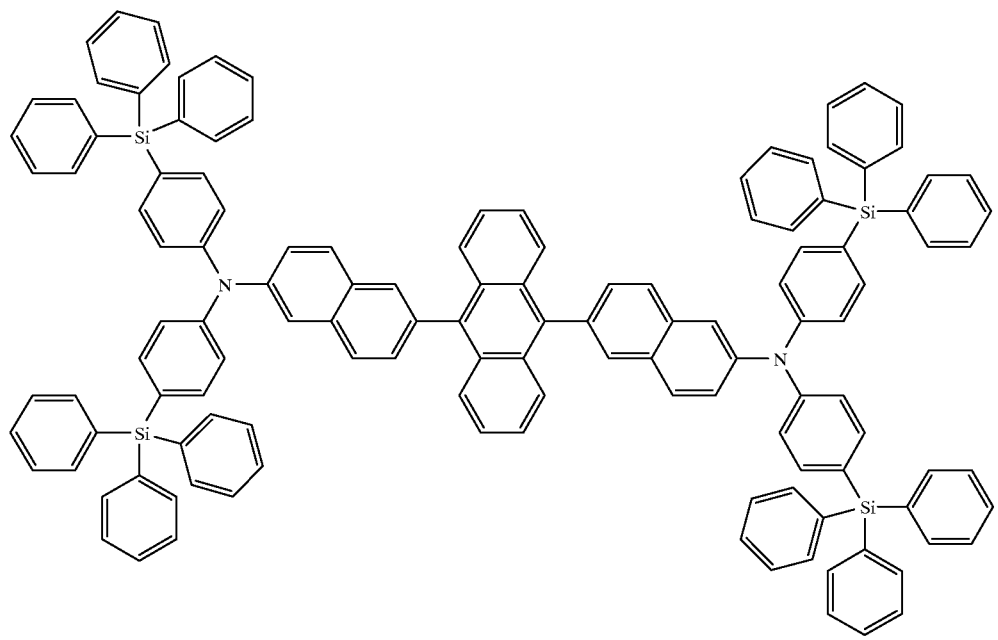
86
The compounds belonging to Group 6 include Nos. 87–94.
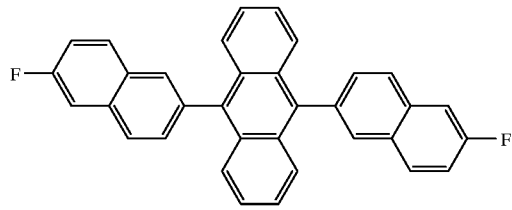
87
-continued
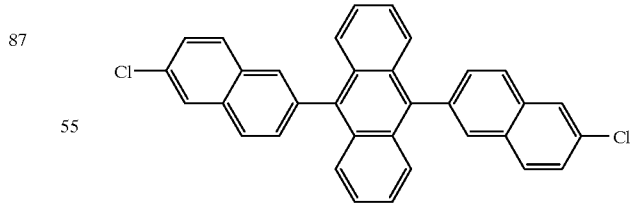
88

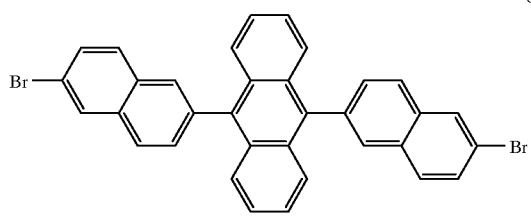

89

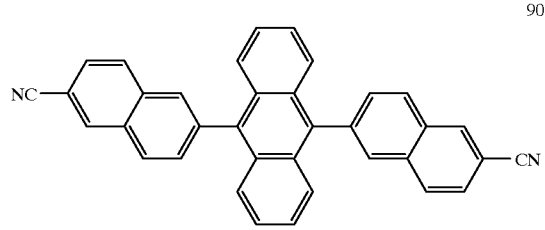

90

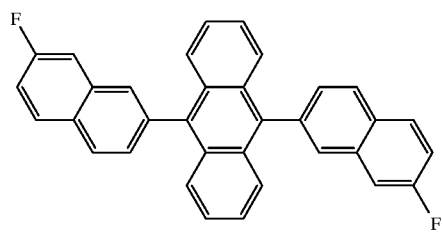

91

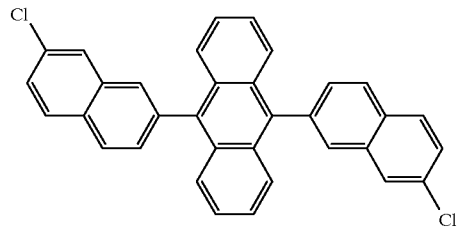

92

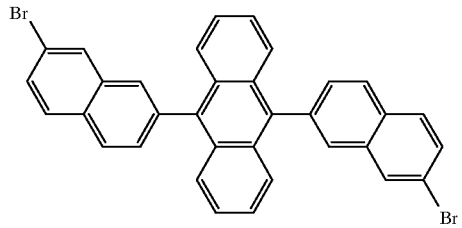

93

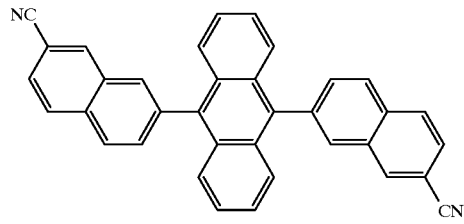

94

A preferred embodiment of the luminescent layer comprises a multi-component material consisting of a host material doped with one or more components of fluorescent dyes or electron trapping agents. Using this method, highly efficient EL devices can be constructed. Simultaneously, the color of the EL devices can be tuned by using fluorescent dyes of different emission wavelengths in a common host material. This dopant scheme has been described in considerable details for EL devices using Alq as the host material by Tang et al [J. Applied Physics, Vol. 65, Pages 3610–3616, 1989; U.S. Pat. No 4,769,292].

An important relationship for choosing a fluorescent dye as a dopant capable of modifying the hue of light emission when present in a host material is a comparison of their bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. An advantage of using a blue host such as of 9,10-di-(2-naphthyl) anthracene derivative is that its bandgap is sufficiently large to effect energy transfer to a range of commonly available fluorescent dyes emitting in the blue. These blue dopants includes arylamines, coumarins, stilbenes, distrylstilbenes, derivatives of anthracene, tetracene, perylene, and other conjugated benzenoids. Other dopants for EL emissions at longer wavelengths include coumarins, rhodamines and other green or red emitting fluorescent dyes.

In a preferred embodiment, the EL light emitting layer can comprise a host material and a gas molecule acting as a dopant. The following is a listing of gas molecules which funcation as a fluorescent sensitizing dye that are contemplated for use in the practice of the invention:

SD1

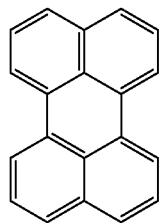

SD2

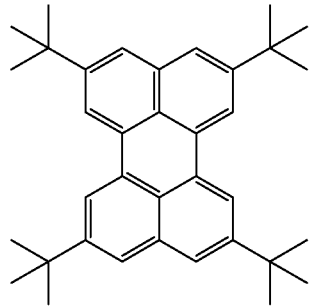

SD3

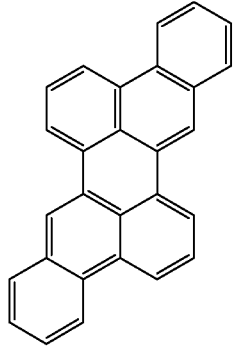

-continued

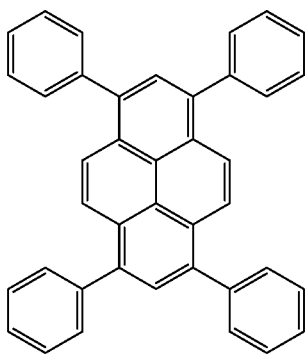
SD4

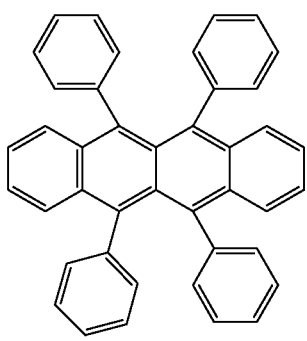
SD5

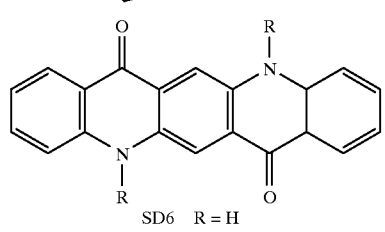
SD6  R = H
SD7  R = Me

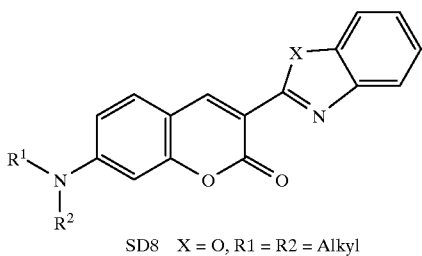
SD8  X = O, R1 = R2 = Alkyl
SD8  X = S, R1 = R2 = Alkyl

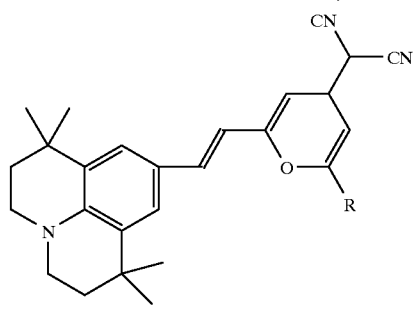
SD10  R = Ph
SD11  R = Me
SD12  R = t-Bu
SD13  R = Mesityl

Preferred materials for use in forming the electron transporting layer (ETL) of the organic EL devices of this invention are metal chelated oxinoid compounds, including chelates of oxine itself (also commonly referred to as 8-quinolinol or 8-hydroxyquinoline). Such compounds exhibit both high levels of performance and are readily fabricated in the form of thin films. Exemplary of contemplated oxinoid compounds are those satisfying the following structural formula:

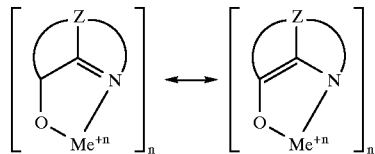

wherein
Me represents a metal;
n is an integer of from 1 to 3; and
Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds are the following:
Aluminum trisoxine [a.k.a, tris(8-quinolinol)aluminum]
Magnesium bisoxine [a.k.a. bis(8-quinolinol)-magnesium]
Indium trisoxine [a.k.a., tris(8-quinolinol)indium]
Lithium oxine (a.k.a., 8-quinolinol lithium)

Another preferred materials for use in forming the electron transporting layer (ETL) of the organic EL devices of this invention are the benzazole compound of molecular formula (VIII), which has been disclosed in detail by Shi et al in commonly-assigned U.S. Pat. No. 5,645,948.

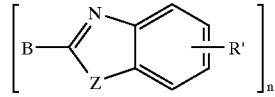
Formula VIII wherein:
n is an integer of from 2 to 8;
Z is O, NR or S; and
R and R' are individually hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl, pyridyl, quinolinyl and other heterocyclic systems; or halo such as chloro, fluoro; or atoms necessary to complete a fused aromatic ring;

B is a linkage unit consisting of alkyl, aryl, substituted alkyl, or substituted aryl which conjugatedly or unconjugatedly connects the multiple benzazoles together.

Illustrative of useful electron transport (ET) materials of this class are the following:

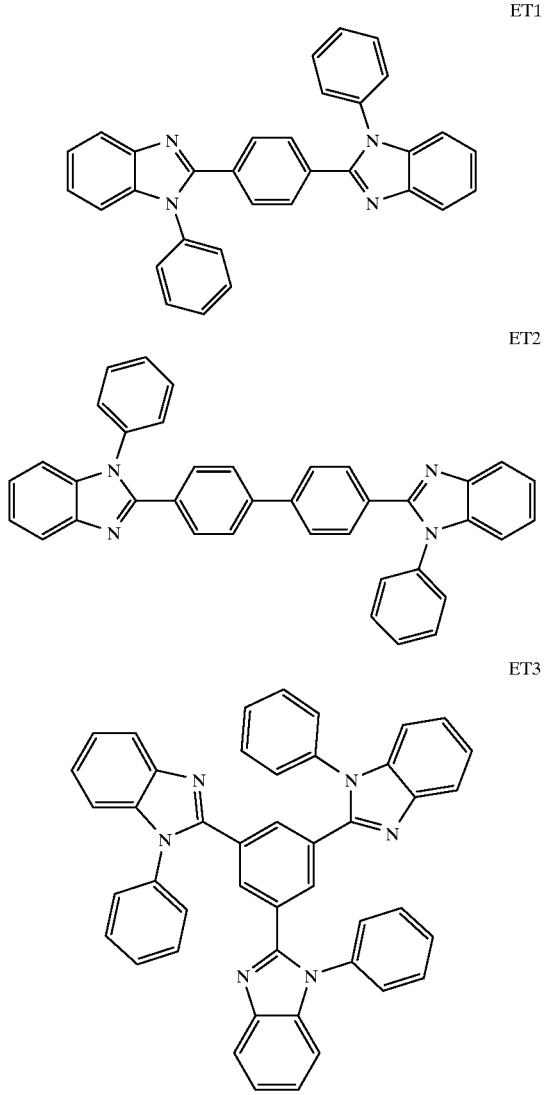

The preferred materials for the multi-layers of the organic EL medium are each capable of film-forming—that is, capable of being fabricated as a continuous layer having a thickness of less than 5000 Angstroms. A preferred method for forming the organic EL medium is by vacuum vapor deposition. Extremely thin defect-free continuous layers can be formed by this method. Specifically, the individual layer thickness as low as about 50 Angstroms can be constructed while still realizing satisfactory EL device performance. It is generally preferred that the overall thickness of the organic EL medium be at least about 1000 Angstroms.

Other methods for forming thin films in EL devices of this invention include spin-coating from a solution containing the EL material. A combination of spin-coating method and vacuum vapor deposition method is also useful for the fabrication of multi-layer EL devices.

The anode and cathode of the organic EL device can each take any convenient conventional form. Where it is intended to transmit light from the organic EL device through the anode, this can be conveniently achieved by coating a thin conductive layer onto a light transparent substrate—e.g., a transparent or substantially transparent glass plate or plastic film. In one form the organic EL devices of this invention can follow the historical practice of including a light transparent anode formed of tin oxide or indium tin oxide coated on a glass plate, as disclosed by Gurnee et al U.S. Pat. No. 3,172,862, Gurnee U.S. Pat. No. 3,173,050, Dresner "Double Injection Electroluminescence in Anthracene", *RCA Review*, Volume 30, pages 322–334, 1969; and Dresner U.S. Pat. No. 3,710,167 cited above.

The organic EL devices of this invention can employ a cathode constructed of any metal, including any high or low work function metal, heretofore taught to be useful for this purpose. Unexpected fabrication, performance, and stability advantages have been realized by forming the cathode of a combination of a low work function metal and at least one other metal. For further disclosure, see commonly-assigned U.S. Pat. No. 4,885,211 by Tang and Van Slyke, the disclosure of which is incorporated by reference herein.

EXAMPLES

The invention and its advantages are further illustrated by the specific examples as follows:

Example 1

Synthesis of 2-naphthylene Boronic Acid

A solution of n-BuLi (1.6 M in hexane, 100 mL, 0.16 mol) was added via an addition funnel to 2-bromonaphthalene (30.0 g, 0.14 mol) in 200 mL of dry THF at −78° C. The yellow suspension was stirred at this temperature for a half hour, a solution of B(OMe)$_3$ (26.6 mL, 29.1 g, 0.28 mol) in 150 mL of dry THF was added dropwise, with the temperature kept below −60° C. The resulting colorless solution was allowed to warm to room temperature overnight, then 300 mL of 10 M HCl was added and the mixture stirred for a further hour under nitrogen. Water and ether were added, and the aqueous layer was extracted several times with ether. The combined organic extracts were dried over MgSO$_4$ and evaporated under reduced pressure to yield a white solid (21.0 g, 95%), which was used in the coupling reaction without further purification.

Example 2

Synthesis of 9,10-di-(2-naphthyl)anthracene (Compound 1)

Pd(PPh$_3$)$_4$ (1.0 g, 0.8 mmol) and 300 mL of 2.0 M aqueous Na$_2$CO$_3$ were added to a solution of 9.10-dibromoanthracene (34.0 g, 0.1 mol) and 2-naphthylene boronic acid (40.0 g, 0.232 mol) in 600 mL of toluene and 100 mL of ethanol. The reaction mixture was purged with nitrogen for 10 min. After refluxing overnight, the organic suspension layer was separated while hot and was added 300 mL of 2.0 N HCl and refluxed for one hour with vigorous stirring. The aqueous layer was separated again while hot followed by washing with water three times until pH is about 7. The precipitates from the organic layer was filtered and washed with small amount of cold acetone followed by toluene. After drying, 34.0 g of pure 9,10-di-(2-naphthyl) anthracene (Compound 1) was obtained. Yield 80.0%.

Example 3

Synthesis of 9,10-di-[2-(6-methoxynaphthyl)] anthracene (Compound 54)

To a suspension of 22.0 g (0.09 mol) of 9.10-dibromoanthracene and 0.75 g of bis(triphenylphosphine) palladium(II) chloride in 200 mL of dry THF at reflux was added a solution of 6-methoxy 2-naphthylmagnesium bromide, which was fresh by prepared from 50.0 g (0.211 mol) of 6-methoxy 2-bromonaphthylene in 400 mL of dry THF and 5.6 g of magnesium in 100 mL of dry THF with 1,2-dibromoethane as an initiator. After addition, the reaction mixture was maintained at reflux for three hours. Then it was cooled and 100 mL of THF and 50 mL of 15% hydrochloric acid was carefully added. After removal of the solvents by vacuum rotary evaporator, the residue was filtered and washed with water until the pH=7. The crude product was refluxed in 500 mL of dichloromethane for one hour. After cooling, it was filtered and washed with a small amount of cold acetone to give 34.0 g of pure 9,10-di-[2-(6-methoxynaphthyl)]anthracene (Compound 54). Yield 77.1%.

EL Device Fabrication and Performance

Example 4

An EL device satisfying the requirements of the invention was constructed in the following manner. The organic EL medium has four organic layers, namely, a hole-injection layer, a hole transport layer, a light emitting layer, and an electron-transport layer:

a) An indium-tin-oxide (ITO) coated glass substrate was sequentially ultra-sonicated in a commercial detergent, rinsed in deionized water, degreased in toluene vapor and exposed to ultraviolet light and ozone for a few minutes.

b) A hole injection layer of copper phthalocyanine (150 Angstroms) was then deposited on top of the ITO coated substrate by evaporation from a tantalum boat.

c) Onto the copper phthalocyanine layer was deposited a hole transport layer of N,N'-bis-(1-naphthyl)-N,N'-diphenylbenzidine (600 Angstroms), also by evaporation from a tantalum boat.

d) A light emitting layer of 9,10-di-(2-naphthyl) anthracene (Compound 1) (350 Angstroms) was then deposited onto the hole-transport layer.

e) A electron-transport layer of Alq (350 Angstroms) was then deposited onto the light emitting layer.

f) On top of the Alq layer was deposited a cathode layer (2000 Angstroms) formed of a 10:1 atomic ratio of Mg and Ag.

The above sequence completed the deposition of the EL device. The device was then hermetically packaged in a dry glove box for protection against ambient environment.

The light output from this EL device was 333 cd/m$^2$ when it was driven by a current source of 20 mA/cm$^2$. The EL color is blue with 1931 CIE color coordinates of X=0.187 and Y=0.218.

Example 5

An EL device satisfying the requirements of the invention was constructed in the same manner as in example 4 by using ET3 as an electron transporting layer.

a) An indium-tin-oxide (ITO) coated glass substrate was sequentially ultra-sonicated in a commercial detergent, rinsed in deionized water, degreased in toluene vapor and exposed to ultraviolet light and ozone for a few minutes.

b) A hole injection layer of copper phthalocyanine (150 Angstroms) was then deposited on top of the ITO coated substrate by evaporation from a tantalum boat.

c) Onto the copper phthalocyanine layer was deposited a hole transport layer of N,N'-bis-(1-naphthyl)-N,N'-diphenylbenzidine (600 Angstroms), also by evaporation from a tantalum boat.

d) A light emitting layer 9,10-di-(2-naphthyl)anthracene (Compound 1) (350 Angstroms) was then deposited onto the hole-transport layer.

e) A electron-transport layer of ET3 (350 Angstroms) was then deposited onto the light emitting layer.

f) On top of the ET-3 layer was deposited a cathode layer (2000 Angstroms) formed of a 10:1 atomic ratio of Mg and Ag.

The above sequence completed the deposition of the EL device. The device was then hermetically packaged in a dry glove box for protection against ambient environment.

The light output from this EL device was 350 cd/m$^2$ when it was driven by a current source of 20 mA/cm$^2$. The EL color is blue with 1931 CIE color coordinates of X=0.152 and Y=0.097. The EL spectrum shown in FIG. 2 has a peak emission at 448 nm.

Example 6

An EL device satisfying the requirements of the invention was constructed in the same manner as in example 4 by using 9,10-di-[2-(6-methoxynaphthyl)]anthracene (compound 54) as a light emitting layer.

a) An indium-tin-oxide (ITO) coated glass substrate was sequentially ultrasonicated in a commercial detergent, rinsed in deionized water, degreased in toluene vapor and exposed to ultraviolet light and ozone for a few minutes.

b) A hole injection layer of copper phthalocyanine (150 Angstroms) was then deposited on top of the ITO coated substrate by evaporation from a tantalum boat.

c) Onto the copper phthalocyanine layer was deposited a hole transport layer of N,N'-bis-(1-naphthyl)-N,N'-diphenylbenzidine (600 Angstroms), also by evaporation from a tantalum boat.

d) A light emitting layer 9,10-di-[2-(6-methoxynaphthyl)]-anthracene(Compound 54) (350 Angstroms) was then deposited onto the hole-transport layer.

e) A electron-transport layer of Alq (350 Angstroms) was then deposited onto the light emitting layer.

f) On top of the Alq layer was deposited a cathode layer (2000 Angstroms) formed of a 10:1 atomic ratio of Mg and Ag.

The above sequence completed the deposition of the EL device. The device was then hermetically packaged in a dry glove box for protection against ambient environment.

The light output from this EL device was 431 cd/m$^2$ when it was driven by a current source of 20 mA/cm$^2$. The EL color is blue with 1931 CIE color coordinates of X=0.179 and Y=0.199.

Example 7

An EL device satisfying the requirements of the invention was constructed in the same manner as in example 4 by doping blue fluorescent sensitizing dye SD2 into 9,10-di-(2-naphthyl)anthracene (Compound 1) as a light emitting layer.

a) An indium-tin-oxide (ITO) coated glass substrate was sequentially ultrasonicated in a commercial detergent, rinsed in deionized water, degreased in toluene vapor and exposed to ultraviolet light and ozone for a few minutes.

b) A hole injection layer of copper phthalocyanine (150 Angstroms) was then deposited on top of the ITO coated substrate by evaporation from a tantalum boat.

c) Onto the copper phthalocyanine layer was deposited a hole transport layer of N,N'-bis-(1-naphthyl)-N,N'-diphenylbenzidine (600 Angstroms), also by evaporation from a tantalum boat.

d) A layer of doped of 9,10-di-(2-naphthyl)anthracene (compound 1) (300 Angstroms) was then deposited onto the hole-transport layer. The doped layer contains 2.0% SD2 which was co-deposited with 9,10-di-(2-naphthyl) anthracene (Compound 1) to form a uniform doped light emitting layer.

e) A electron-transport layer of Alq (350 Angstroms) was then deposited onto the light emitting layer.

f) On top of the Alq layer was deposited a cathode layer (2000 Angstroms) formed of a 10:1 atomic ratio of Mg and Ag.

The above sequence completed the deposition of the EL device. The device was then hermetically packaged in a dry glove box for protection against ambient environment.

The light output from this EL device was 636 cd/m$^2$ when it was driven by a current source of 20 mA/cm$^2$. The EL color is blue with 1931 CIE color coordinates of X=0.154 and Y=0.232. The EL spectrum shown in FIG. 3 has a peak emission at 464 nm. This EL spectrum indicates that EL emission originates SD2 doped with the 9,10-di-(2-naphthyl)anthracene (Compound 1) and is predominantly characteristic of the SD2 dopant.

Example 8

An EL device satisfying the requirements of the invention was constructed in the same manner as in example 4 by doping blue fluorescent sensitizing dye SD2 into 9,10-di-(2-naphthyl)anthracene (compound 1) as a light emitting layer and using ET-3 as an electron transporting layer.

a) An indium-tin-oxide (ITO) coated glass substrate was sequentially ultra-sonicated in a commercial detergent, rinsed in deionized water, degreased in toluene vapor and exposed to ultraviolet light and ozone for a few minutes.

b) A hole injection layer of copper phthalocyanine (150 Angstroms) was then deposited on top of the ITO coated substrate by evaporation from a tantalum boat.

c) Onto the copper phthalocyanine layer was deposited a hole transport layer of N,N'-bis-(1-naphthyl)-N,N'-diphenylbenzidine (600 Angstroms), also by evaporation from a tantalum boat.

d) A layer of doped of 9,10-di-(2-naphthyl)anthracene (EM 1) (300 Angstroms) was then deposited onto the hole-transport layer. The doped layer contains 2.0% SD-2 which was co-deposited with the 9,1-di-(2-naphthyl) anthracene (Compound 1) to form a uniform doped light emitting layer.

e) A electron-transport layer of ET-3 (350 Angstroms) was then deposited onto the light emitting layer.

f) On top of the ET-3 layer was deposited a cathode layer (2000 Angstroms) formed of a 10:1 atomic ratio of Mg and Ag.

The above sequence completed the deposition of the EL device. The device was then hermetically packaged in a dry glove box for protection against ambient environment.

The light output from this EL device was 1006 cd/m$^2$ when it was driven by a current source of 20 mA/cm$^2$. The EL color is blue with 1931 CIE color coordinates of X=0.137 and Y=0.203.

Example 9

An EL device satisfying the requirements of the invention was constructed in the same manner as in example 4 by doping green fluorescent sensitizing dye SD7 into 9,10-di-(2-naphthyl)anthracene (compound 1) as a light emitting layer to produce the green emission.

a) An indium-tin-oxide (ITO) coated glass substrate was sequentially ultrasonicated in a commercial detergent, rinsed in deionized water, degreased in toluene vapor and exposed to ultraviolet light and ozone for a few minutes.

b) A hole injection layer of copper phthalocyanine (150 Angstroms) was then deposited on top of the ITO coated substrate by evaporation from a tantalum boat.

c) Onto the copper phthalocyanine layer was deposited a hole transport layer of N,N'-bis-(1-naphthyl)-N,N'-diphenylbenzidine (600 Angstroms), also by evaporation from a tantalum boat.

d) A layer of doped of 9,10-di-(2-naphthyl)anthracene (compound 1) (300 Angstroms) was then deposited onto the hole-transport layer. The doped layer contains 1.0% SD7 which was co-deposited with the 9,10-di-(2-naphthyl) anthracene (Compound 1) to form a uniform doped light emitting layer.

e) A electron-transport layer of Alq (350 Angstroms) was then deposited onto the light emitting layer.

f) On top of the Alq layer was deposited a cathode layer (2000 Angstroms) formed of a 10:1 atomic ratio of Mg and Ag.

The above sequence completed the deposition of the EL device. The device was then hermetically packaged in a dry glove box for protection against ambient environment.

The light output from this EL device was 1030 cd/m$^2$ when it was driven by a current source of 20 mA/cm$^2$. The EL color is green with 1931 CIE color coordinates of X=0.307 and Y=0.544. The EL spectrum indicates that EL emission originates from SD-7 doped with the 9, 10-di-(2-naphthyl)anthracene (Compound 1) and is predominantly characteristic of the SD7 dopant.

Example 10

An EL device satisfying the requirements of the invention was constructed in the same manner as in example 4 by doping red fluorescent sensitizing dye SD12 into 9,10-di-(2-naphthyl)anthracene (compound 1) as a light emitting layer to produce red emission.

a) An indium-tin-oxide (ITO) coated glass substrate was sequentially ultrasonicated in a commercial detergent, rinsed in deionized water, degreased in toluene vapor and exposed to ultraviolet light and ozone for a few minutes.

b) A hole injection layer of copper phthalocyanine (150 Angstroms) was then deposited on top of the ITO coated substrate by evaporation from a tantalum boat.

c) Onto the copper phthalocyanine layer was deposited a hole transport layer of N,N'-bis-(1-naphthyl)-N,N'-diphenylbenzidine (600 Angstroms), also by evaporation from a tantalum boat.

d) A layer of doped of 9,10-di-(2-naphthyl)anthracene (Compound 1) (300 Angstroms) was then deposited onto the hole-transport layer. The doped layer contains 1.0% SD12 which was co-deposited with the 9,10()-di-(2-naphthyl) anthracene (Compound 1) to form a uniform doped light emitting layer.

e) A electron-transport layer of Alq (350 Angstroms) was then deposited onto the light emitting layer.

f) On top of the Alq layer was deposited a cathode layer (2000 Angstroms) formed of a 10:1 atomic ratio of Mg and Ag.

The above sequence completed the deposition of the EL device. The device was then hermetically packaged in a dry glove box for protection against ambient environment.

The light output from this EL device was 536 cd/m² when it was driven by a current source of 20 mA/cm². The EL color is orange with 1931 CIE color coordinates of X=0.563 and Y=0.424.

Example 11

An EL device satisfying the requirements of the invention was constructed in the same manner as in example 4 by doping red fluorescent sensitizing dye SD12 in an appropriate concentration into 9,10-di-(2-naphthyl)anthracene (Compound 1) as a light emitting layer to produce white emission.

a) An indium-tin-oxide (ITO) coated glass substrate was sequentially ultra-sonicated in a commercial detergent, rinsed in deionized water, degreased in toluene vapor and exposed to ultraviolet light and ozone for a few minutes.

b) A hole injection layer of copper phthalocyanine (150 Angstroms) was then deposited on top of the ITO coated substrate by evaporation from a tantalum boat.

c) Onto the copper phthalocyanine layer was deposited a hole transport layer of N,N'-bis-(1-naphthyl)-N,N'-diphenylbenzidine (600 Angstroms), also by evaporation from a tantalum boat.

d) A layer of doped of 9,10-di-(2-naphthyl)anthracene (Compound 1) (300 Angstroms) was then deposited onto the hole-transport layer. The doped layer contains 0.05% SD12 which co-deposited with the 9,10-di-(2-naphthyl)anthracene (Compound 1) to form a uniform doped light emitting layer.

e) A electron-transport layer of Alq (350 Angstroms) was then deposited onto the light emitting layer.

f) On top of the Alq layer was deposited a cathode layer (2000 Angstroms) formed of a 10:1 atomic ratio of Mg and Ag.

The above sequence completed the deposition of the EL device. The device was then hermetically packaged in a dry glove box for protection against ambient environment.

Figure 4:
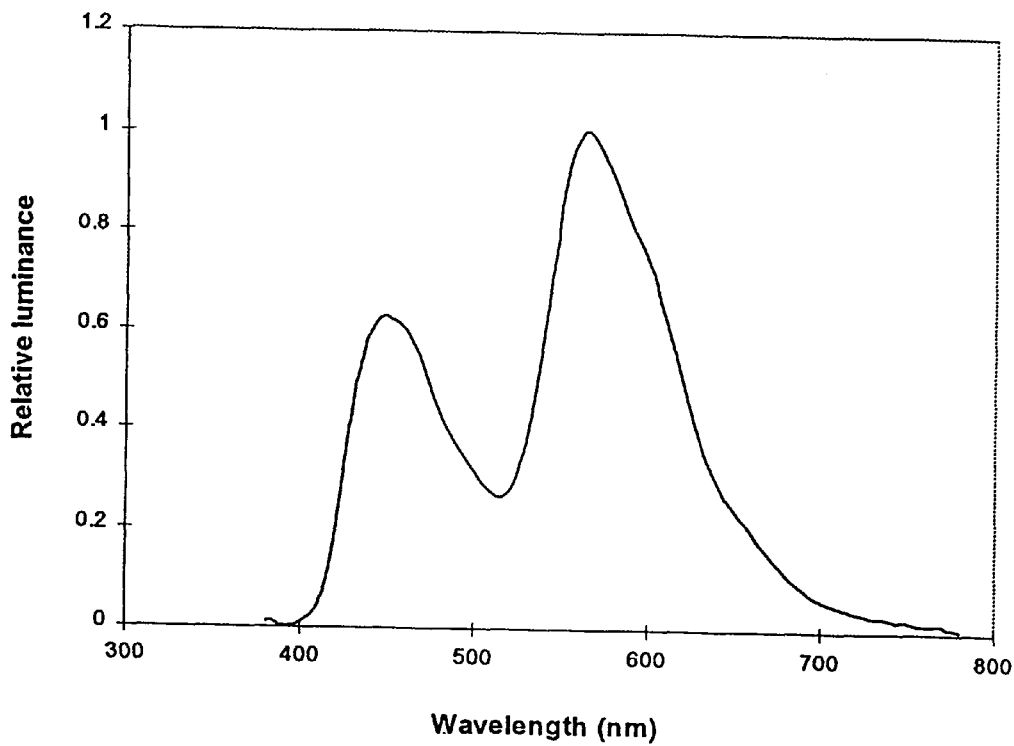
FIG. 4 shows the spectral characteristic of a doped EL device described in Example 11.

The light output from this EL device was 781 cd/m² when it was driven by a current source of 20 mA/cm². The EL color is blue with 1931 CIE color coordinates of X=0.361 and Y=0.362. The EL spectrum shown in FIG. 4 indicates the white EL emission was produced by combination of 9,10-di-(2-naphthyl)anthracene blue emission and SD12 red emission.

These examples show that organic materials of 9,10-di-(2-naphthyl)anthracene derivatives can be effectively used in an organic electroluminescent device and these derivatives include:

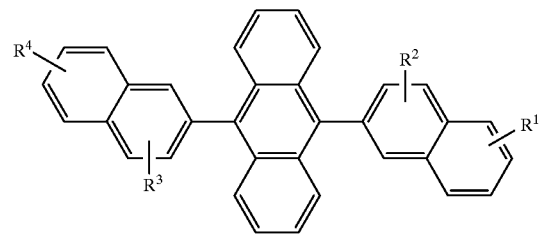

wherein:

$R^1$, $R^2$, $R^3$, and $R^4$ are individual substituents or a group of substituents, each substituent is individually selected from the following groups consisting of:

Group 1 hydrogen, or alkyl of from 1 to 24 carbon atoms;

Group 2 aryl or substituted aryl of from 5 to 20 carbon atoms;

Group 3 carbon atoms necessary to complete a fused aromatic ring of naphthyl, anthracenyl, pyrenyl, or perylenyl;

Group 4 heteroaryl or substituted heteroaryl of from 5 to 24 carbon atoms, carbon atoms necessary to complete a fused heteroaromatic ring of furyl, thienyl, pyridyl, quinolinyl and other heterocyclic systems;

Group 5 alkoxyl, amino, alkyl amino, or aryl amino of from 1 to 24 carbon atoms; and

Group 6 fluorine, chlorine, bromine or cyano.

The invention has been described in detail with particular reference to certain preferred embodiments thereof, but it will be understood that variations and modifications can be effected within the spirit and scope of the invention.

Parts List

10 EL Device
12 glass substrate
14 anode
16 hole injecting layer
18 hole transport layer
20 light-emitting layer
22 electron transport layer
24 cathode

What is claimed is:

1. An organic EL device comprising an anode, a cathode, and an organic electroluminescent element between the anode and the cathode; the organic electroluminescent element includes an organic material or a mixture thereof of 9,10-di-(2-naphthyl)anthracene derivatives.

2. The organic EL device of claim 1 wherein the organic material is selected from the group consisting of:

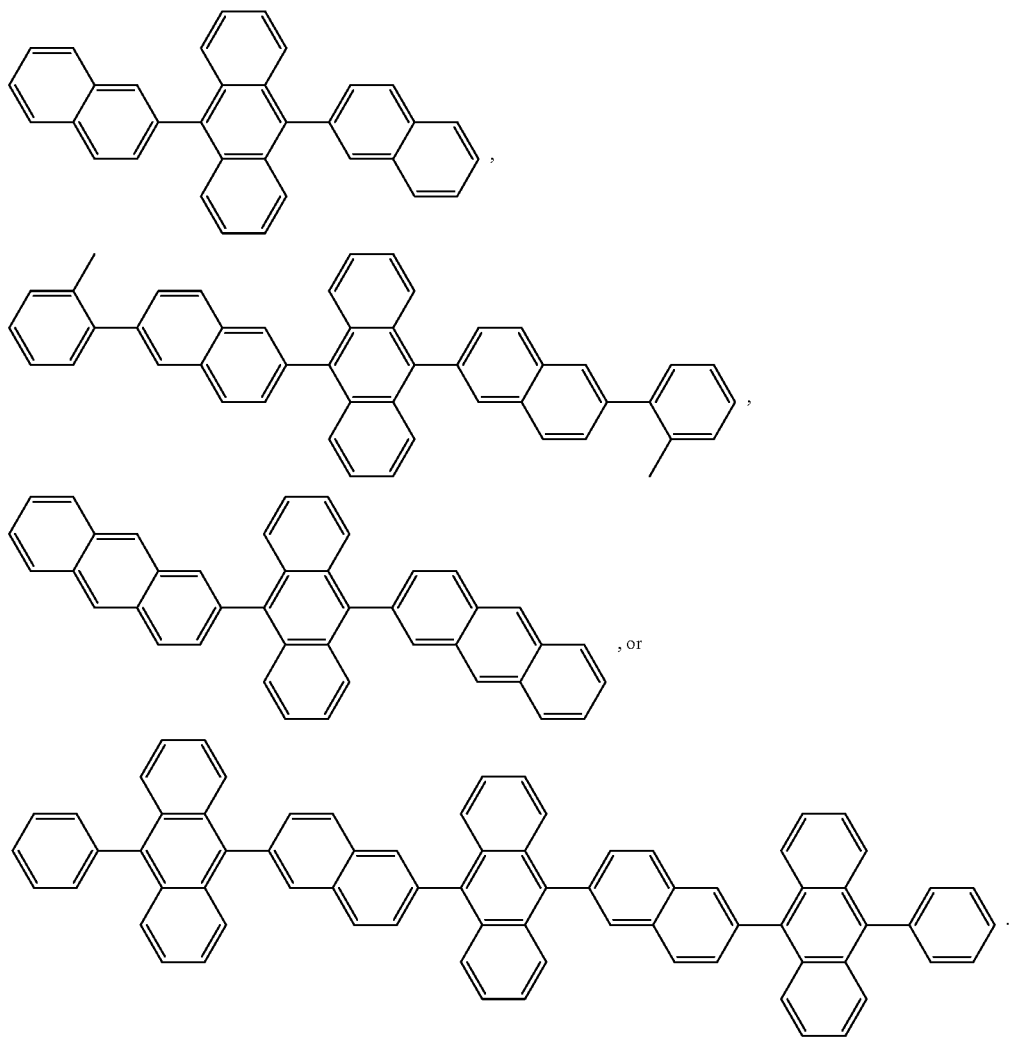

3. An organic EL device comprising an anode, a cathode, and an organic electroluminescent element between the anode and the cathode; the organic electroluminescent element includes an organic material or a mixture thereof having the structure:

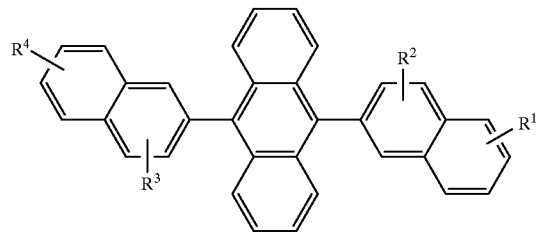

wherein:

$R^1$, $R^2$, $R^3$, and $R^4$ are individual substituents or a group of substituents, each substituent is individually selected from hydrogen, or alkyl of from 1 to 24 carbon atoms.

4. An organic EL device comprising an anode, a cathode, and an organic electroluminescent element between the anode and the cathode; the organic electroluminescent element includes an organic material or a mixture thereof having the structure:

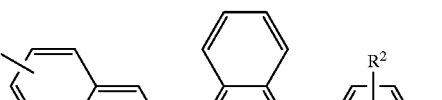

wherein:

$R^1$, $R^2$, $R^3$, and $R^4$ are individual substituents or a group of substituents, each substituent is individually selected from aryl or substituted aryl of from 5 to 20 carbon atoms.

5. An organic EL device comprising an anode, a cathode, and an organic electroluminescent element between the anode and the cathode; the organic electroluminescent element includes an organic material or a mixture thereof having the structure:

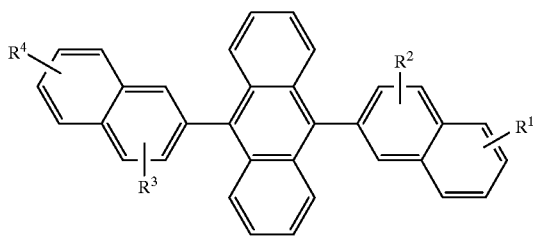

wherein:

$R^1$, $R^2$, $R^3$, and $R^4$ are individual substituents or a group of substituents, each substituent is individually selected from carbon atoms necessary to complete a fused aromatic ring of anthracenyl, pyrenyl, or perylenyl.

6. An organic EL device comprising an anode, a cathode, and an organic electroluminescent element between the anode and the cathode; the organic electroluminescent element includes an organic material or a mixture thereof having the structure:

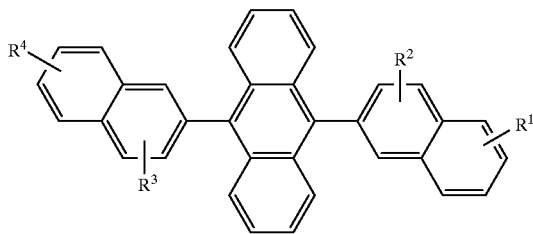

wherein:

$R^1$, $R^2$, $R^3$, and $R^4$ are individual substituents or a group of substituents, each substituent is individually selected from heteroaryl or substituted heteroaryl of from 5 to 24 carbon atoms, carbon atoms necessary to complete a fused heteroaromatic ring of furyl, thienyl, pyridyl, quinolinyl and other heterocyclic systems.

7. An organic EL device comprising an anode, a cathode, and an organic electroluminescent element between the anode and the cathode; the organic electroluminescent element includes an organic material or a mixture thereof having the structure:

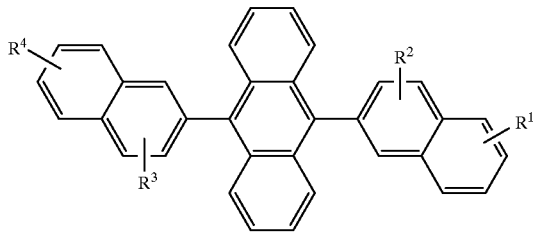

wherein:

$R^1$, $R^2$, $R^3$, and $R^4$ are individual substituents or a group of substituents, each substituent is individually selected from alkoxyl, amino, alkyl amino, or aryl amino of from 1 to 24 carbon atoms.

8. An organic EL device comprising an anode, a cathode, and an organic electroluminescent element between the anode and the cathode; the organic electroluminescent element includes an organic material or a mixture thereof having the structure:

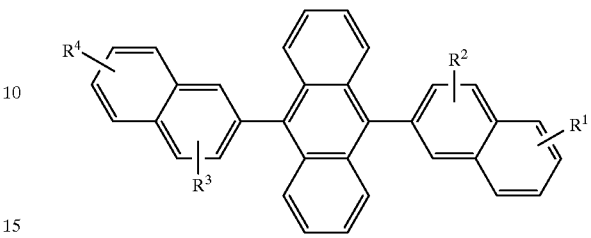

wherein:

$R^1$, $R^2$, $R^3$, and $R^4$ are individual substituent or a group of substituents, each substituent is individually selected from fluorine, chlorine, bromine or cyano.

9. An organic EL device comprising an anode, a cathode, and an organic electroluminescent element between the anode and the cathode; the organic electroluminescent element includes an organic material or a mixture thereof having the structure:

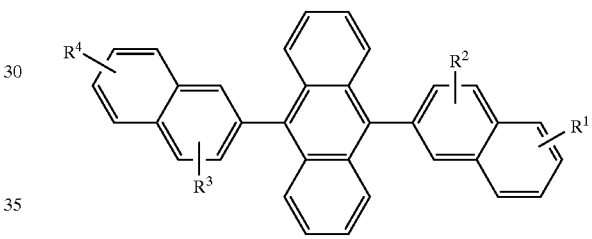

wherein:

$R^1$, $R^2$, $R^3$, and $R^4$ are individual substituents or a group of substituents, each substituent is individually selected from the following groups consisting of:

Group 1
 hydrogen, or alkyl of from 1 to 24 carbon atoms;
Group 2
 aryl or substituted aryl of from 5 to 20 carbon atoms;
Group 3
 carbon atoms necessary to complete a fused aromatic ring of naphthyl, anthracenyl, pyrenyl, or perylenyl;
Group 4
 heteroaryl or substituted heteroaryl of from 5 to 24 carbon atoms, carbon atoms necessary to complete a fused heteroaromatic ring of furyl, thienyl, pyridyl, quinolinyl and other heterocyclic systems;
Group 5
 alkoxyl, amino, alkyl amino, or aryl amino of from 1 to 24 carbon atoms; and
Group 6
 fluorine, chlorine, bromine or cyano.

* * * * *

UNITED STATES PATENT AND TRADEMARK OFFICE
CERTIFICATE OF CORRECTION

PATENT NO. : 5,935,721
DATED : August 10, 1999
INVENTOR(S) : Jianmin Shi, et al

It is certified that error appears in the above-identified patent and that said Letters Patent is hereby corrected as shown below:

On the title page, and column 1, item:

[54] Title -- ORGANIC ELECTROLUMINESCENT ELEMENT FOR STABLE ELECTROLUMINESCENT DEVICES--

Signed and Sealed this

Twenty-fifth Day of January, 2000

Attest:

*Attesting Officer*

*Acting Commissioner of Patents and Trademarks*